(12) United States Patent
Sumitani

(10) Patent No.: US 6,944,093 B2
(45) Date of Patent: Sep. 13, 2005

(54) SEMICONDUCTOR MEMORY DEVICE

(75) Inventor: Ken Sumitani, Tenri (JP)

(73) Assignee: Sharp Kabushiki Kaisha, Abeno-ku (JP)

(*) Notice: Subject to any disclaimer, the term of this patent is extended or adjusted under 35 U.S.C. 154(b) by 0 days.

(21) Appl. No.: 10/612,319

(22) Filed: Jul. 1, 2003

(65) Prior Publication Data

US 2004/0004862 A1 Jan. 8, 2004

(30) Foreign Application Priority Data

Jul. 3, 2002 (JP) ..................................... 2002-195025

(51) Int. Cl.⁷ .............................................. G11C 13/04
(52) U.S. Cl. .............. 365/235; 365/189.05; 365/230.08
(58) Field of Search ........................... 365/235, 189.05, 365/230.08, 189.07, 189.12, 230.03, 189.01, 185.33, 238.5, 104, 204, 230.06

(56) References Cited

U.S. PATENT DOCUMENTS

| 4,468,755 | A | * | 8/1984 | Iida ............................. 345/668 |
| 5,751,657 | A | * | 5/1998 | Hotta ....................... 365/238.5 |
| 5,930,194 | A | * | 7/1999 | Yamagata et al. ..... 365/230.03 |
| 6,134,169 | A | * | 10/2000 | Tanaka ........................ 365/222 |
| 6,636,444 | B2 | * | 10/2003 | Uchida et al. .......... 365/189.05 |
| 2001/0004329 | A1 | * | 6/2001 | Koshikawa ............. 365/189.05 |
| 2004/0042284 | A1 | * | 3/2004 | Sato ............................ 365/200 |
| 2004/0193774 | A1 | * | 9/2004 | Iwata et al. ..................... 711/1 |

* cited by examiner

Primary Examiner—Anh Phung
Assistant Examiner—Dang T. Nguyen
(74) Attorney, Agent, or Firm—Morrison & Foerster LLP

(57) ABSTRACT

A semiconductor memory device is provided, which comprises a memory array comprising a plurality of memory cells, a page buffer section for temporarily storing data to be written into the memory array, and a masking section for masking at least a portion of data read from the page buffer section.

7 Claims, 13 Drawing Sheets

FIG. 4A

| Write Word Address | Write Data (Low Byte) | Write Data (High Byte) |
|---|---|---|
| 1006H | - | Data0 |
| 1007H | Data1 | Data2 |
| 1008H | Data3 | Data4 |
| 1009H | Data5 | Data6 |
| 100AH | Data7 | Data8 |
| 100BH | Data9 | Data10 |
| 100CH | Data11 | Data12 |
| 100DH | Data13 | Data14 |
| 100EH | Data15 | Data16 |
| 100FH | Data17 | Data18 |
| 1010H | Data19 | Data20 |
| 1011H | Data21 | Data22 |
| 1012H | Data23 | Data24 |
| 1013H | Data25 | Data26 |
| 1014H | Data27 | Data28 |
| 1015H | Data29 | Data30 |
| 1016H | Data31 | - |

FIG. 4B

| Page Buffer Read Address | Page Buffer Output Data (Low Byte) | Page Buffer Output Data (High Byte) |
|---|---|---|
| 06H | Masked Data | Data0 |
| 07H | Data1 | Data2 |
| 08H | Data3 | Data4 |
| 09H | Data5 | Data6 |
| 0AH | Data7 | Data8 |
| 0BH | Data9 | Data10 |
| 0CH | Data11 | Data12 |
| 0DH | Data13 | Data14 |
| 0EH | Data15 | Data16 |
| 0FH | Data17 | Data18 |
| 10H | Data19 | Data20 |
| 11H | Data21 | Data22 |
| 12H | Data23 | Data24 |
| 13H | Data25 | Data26 |
| 14H | Data27 | Data28 |
| 15H | Data29 | Data30 |
| 16H | Data31 | Masked Data |

FIG. 4C

| Page Buffer Read Address | Page Buffer Output Data (Low Byte) | Page Buffer Output Data (High Byte) |
|---|---|---|
| 04H | Masked Data | Masked Data |
| 05H | Masked Data | Masked Data |
| 06H | Masked Data | Data0 |
| 07H | Data1 | Data2 |
| 08H | Data3 | Data4 |
| 09H | Data5 | Data6 |
| 0AH | Data7 | Data8 |
| 0BH | Data9 | Data10 |
| 0CH | Data11 | Data12 |
| 0DH | Data13 | Data14 |
| 0EH | Data15 | Data16 |
| 0FH | Data17 | Data18 |
| 10H | Data19 | Data20 |
| 11H | Data21 | Data22 |
| 12H | Data23 | Data24 |
| 13H | Data25 | Data26 |
| 14H | Data27 | Data28 |
| 15H | Data29 | Data30 |
| 16H | Data31 | Masked Data |
| 17H | Masked | Masked Data |

FIG. 11A
CONVENTIONAL ART

| Write Word Address | Write Data (Low Byte) | Write Data (High Byte) |
|---|---|---|
| 1006H | - | Data0 |
| 1007H | Data1 | Data2 |
| 1008H | Data3 | Data4 |
| 1009H | Data5 | Data6 |
| 100AH | Data7 | Data8 |
| 100BH | Data9 | Data10 |
| 100CH | Data11 | Data12 |
| 100DH | Data13 | Data14 |
| 100EH | Data15 | Data16 |
| 100FH | Data17 | Data18 |
| 1010H | Data19 | Data20 |
| 1011H | Data21 | Data22 |
| 1012H | Data23 | Data24 |
| 1013H | Data25 | Data26 |
| 1014H | Data27 | Data28 |
| 1015H | Data29 | Data30 |
| 1016H | Data31 | - |

FIG. 11B
CONVENTIONAL ART

| Page Buffer Address | Page Buffer Data (Low Byte) | Page Buffer Data (High Byte) |
|---|---|---|
| 0H | Data19 | Data20 |
| 1H | Data21 | Data22 |
| 2H | Data23 | Data24 |
| 3H | Data25 | Data26 |
| 4H | Data27 | Data28 |
| 5H | Data29 | Data30 |
| 6H | Data31 | Data0 |
| 7H | Data1 | Data2 |
| 8H | Data3 | Data4 |
| 9H | Data5 | Data6 |
| AH | Data7 | Data8 |
| BH | Data9 | Data10 |
| CH | Data11 | Data12 |
| DH | Data13 | Data14 |
| EH | Data15 | Data16 |
| FH | Data17 | Data18 |

FIG. 11C
CONVENTIONAL ART

| Write Word Address | Write Data (Low Byte) | Write Data (High Byte) |
|---|---|---|
| 1006H | Data31 | Data0 |
| 1007H | Data1 | Data2 |
| 1008H | Data3 | Data4 |
| 1009H | Data5 | Data6 |
| 100AH | Data7 | Data8 |
| 100BH | Data9 | Data10 |
| 100CH | Data11 | Data12 |
| 100DH | Data13 | Data14 |
| 100EH | Data15 | Data16 |
| 100FH | Data17 | Data18 |
| 1010H | Data19 | Data20 |
| 1011H | Data21 | Data22 |
| 1012H | Data23 | Data24 |
| 1013H | Data25 | Data26 |
| 1014H | Data27 | Data28 |
| 1015H | Data29 | Data30 |
| 1016H | Data31 | Data0 |

SEMICONDUCTOR MEMORY DEVICE

BACKGROUND OF THE INVENTION

1. Field of the Invention

The present invention relates to a semiconductor memory device. More particularly, the present invention relates to a semiconductor memory device comprising a page buffer section for temporarily storing data to be written into a memory array.

2. Description of the Related Art

In widely used semiconductor memory devices, when data is written into a memory array at a relatively low rate, a page buffer circuit is provided for temporarily storing data to be written into a memory array so that data is read out from the page buffer circuit at a rate suitable for a rate at which data is written into the memory array. A representative example of such a semiconductor memory device is a flash memory.

Hereinafter, a data write operation using a page buffer circuit will be described, illustrating a conventional flash memory.

FIG. 9 is a block diagram showing a conventional flash memory 500 having a page buffer circuit. In FIG. 9, portions of the flash memory 500 which are involved in a write operation are shown.

The flash memory 500 has a user interface (hereinafter referred to as UI) circuit 510, a page buffer circuit 520, a write state machine (hereinafter referred to as WSM) circuit 530, a write control circuit 540, a memory array 550 including a plurality of memory cells, and a read circuit 560.

The flash memory 500 receives and outputs control signals, address signals and data signals from and to the outside via a control bus 501, an address bus 502 and a data bus 503, respectively.

When the flash memory 500 is supplied with a control signal indicating a write operation, a write address signal or a data signal from the outside via the control bus 501, the address bus 502, and the data bus 503, respectively, the contents of such signals are interpreted by the UI circuit 510. The UI circuit 510 then supplies a control signal via a control bus 511 to the page buffer circuit 520, which instructs the page buffer circuit 520 to store write data to be written into memory cells in the memory array 550.

When the page buffer circuit 520 is supplied with the control signal via the control bus 511 from the UI circuit 510, data is stored via a data bus 513 with respect to an address indicated by an address signal transmitted via an address bus 512. When data has been stored in the page buffer circuit 520, a control signal, which instructs the WSM circuit 530 to start a write operation, is supplied from the UI circuit 510 to the WSM circuit 530 via a control bus 514.

When the WSM circuit 530 is supplied with the control signal via the control bus 514 from the UI circuit 510, another control signal, which instructs the page buffer circuit 520 to read data, and an address signal indicating a read address are supplied by the WSM circuit 530 to the page buffer circuit 520 via a control bus 532 and an address bus 535, respectively. Data is read out from the page buffer circuit 520 in accordance with these signals and is supplied via a data bus 521 to the WSM circuit 530.

The memory array 550 is supplied with the address signal and the control signal from the WSM circuit 530 via the address bus 535 and a control bus 536, respectively.

The memory array 550 comprises a decoder. When a control signal is supplied via the control bus 536, which indicates that data is written into the memory array 550, in the memory array 550 the address signal and the control signal are decoded by the decoder; a word line and a bit line corresponding to a memory cell for write data are selected; the desired memory cell is selected; and the memory cell is set in a write mode.

Further, the write control circuit 540 is also supplied with data, which has been read from the page buffer circuit 520, via a data bus 533 from the WSM circuit 530. The write control circuit 540 is also supplied with a control signal, which instructs the write control circuit 540 to write data into memory cells in the memory array 550, via a control bus 534 from the WSM circuit 530.

When the write control circuit 540 is supplied with a data signal indicating write data via the data bus 533 and the control signal via the control bus 534 from the WSM circuit 530, a bit signal is supplied to the memory array 550 via a bit line bus 551 for a memory cell contained in the memory array 550, and a write operation is performed on the memory cell.

After the write operation is performed, when a verification operation for verifying whether or not the memory cell has reached a desired threshold voltage is required, a read operation is performed on the memory cell and the read circuit 560 senses a current flowing through the bit line to verify whether or not a voltage corresponding to the sensed current reaches the threshold voltage.

In this verification operation, an address signal and a control signal are supplied from the WSM circuit 530 to the memory array 550 via the address bus 535 and the control bus 536, respectively, so that the memory cell for which a write operation has been performed is set into a read mode. In the read circuit 560, when a control signal is supplied from the WSM circuit 530 via a control bus 537, data is read from the memory cell and the read data is output via a data bus 561 to the WSM circuit 530.

In the WSM circuit 530, write data to be supplied via the data bus 533 is compared with the current write status supplied via the data bus 561 so as to determine whether or not the write operation has been completed. When the result of the comparison shows that the write operation has been adequately performed, it is considered that the write operation for the memory cell has been completed. When it is determined that the write operation has not been adequately performed, a write operation is performed again for a memory cell for which a write operation has been inadequately performed.

The UI circuit 510 uses the write status of the memory array 550 transferred via a control bus 531 so as to determine a state transition of the memory array 550, and can also output the write status of the memory array 550 via the data bus 503 to the outside.

In the flash memory 500, a series of the above-described write operations are repeated until all data stored in the page buffer circuit 520 has been written into the memory array 550.

FIG. 10 is a flowchart for explaining a write procedure for the flash memory 500. Here, for example, it is assumed that data write in the flash memory 500 is controlled using a single data bus width and both a read operation and a write operation are performed using the data bus width. Note that although various settings, verification operations, voltage controls, and the like are actually required in addition to a procedure described below, description is omitted for procedures which are not directly involved in a write operation.

Before the start of a write operation, in step 7001 the memory array 550 (see FIG. 9) is set into the write mode. In the flash memory 500, since a high voltage is generally required for a write operation, a predetermined high voltage is fixedly used so as to avoid resetting of the voltage every time data write is performed, so that the high voltage is maintained until a series of write operations are completed. This has the effect of increasing the speed of the memory array 550.

Next, in step 7002, an internal address of the flash memory 500 is set to a beginning address from which data write is performed.

Next, in step 7003, data is read from the page buffer circuit 520 (see FIG. 9).

Next, in step 7004, data stored in the page buffer circuit 520 is written into memory cells at an address indicated by the internal address.

In step 7005, it is determined whether or not the current internal address is the end address for write data. When the current internal address is the end address, the series of write operations is completed. When the current internal address is not the end address, in step 7006 the internal address is updated by an internal address updating section (e.g., the internal address is incremented by an increment section) and the process returns to step 7003. This process loop is repeated until data write is completed up to the end address.

As described above, all data stored in the page buffer circuit 520 can be written into the memory array 550.

Next, a description will be given of the case where data write is controlled depending on the width of a data bus of the flash memory 500. At present, there are dominantly a byte-mode data bus which handles data on a byte-by-byte basis (one byte contains 8 bits) and a word-mode data bus which handles data on a word-by-word basis (one word contains 16 bits). In the flash memory 500, either of these data buses can be arbitrarily selected by a user.

Here, it is assumed that the size of the page buffer circuit 520 is 16 words or 32 bytes (i.e., 256 bits). It is also assumed that the sequence of write data to the page buffer circuit 520 is arbitrarily determined, except for the beginning address; and an address in the memory array 550, at which data is written, is determined based on an address signal indicating an address externally input to the flash memory 500.

FIG. 11 shows a relationship between data and addresses indicated by address signals input to the flash memory 500 and a data signal; a relationship between addresses of the page buffer circuit 520 and data stored at the addresses of the page buffer circuit 520; and a relationship between addresses of the memory array 550 and data read from the page buffer circuit 520 so as to be written at the addresses of the memory array 550.

FIG. 11A is a table showing addresses (Write Word Address) indicated by address signals input into the flash memory 500, and data containing lower bytes (Write Data (Low Byte)) and upper bytes (Write Data (High Byte)).

FIG. 11B is a table showing addresses (Page Buffer Address) of the page buffer circuit 520, and data containing lower bytes (Page Buffer Data (Low Byte)) and upper bytes (Page Buffer Data (High Byte)), which are stored at the addresses of the page buffer circuit 520.

FIG. 11C is a table showing addresses (Write Word Address) at which data is to be written in the memory array 550, and data containing lower bytes (Write Data (Low Byte)) and upper bytes (Write Data (High Byte)), which are read from the page buffer circuit 520.

When write data as shown in FIG. 11A is input to the flash memory 500 in a byte mode, data is stored in the page buffer circuit 520 as shown in FIG. 11B.

For example, Write Word Addresses 1006H, 1007H, . . . , 100EH, and 100FH of the memory array 550 (FIG. 11A) correspond to Page Buffer Addresses 6H, 7H, . . . , EH, and FH of the page buffer circuit 520 (FIG. 11B). Write Word Addresses 1010H, 1011H, . . . , 1015H, and 1016H of the memory array 550 (FIG. 11A) correspond to Page Buffer Addresses 0H, 1H, . . . , 5H, and 6H of the page buffer circuit 520 (FIG. 11B). Note that the affix 'H' represents hexadecimal notation.

Even when an external data bus is switched between an 8-bit bus and a 16-bit bus, it is preferable that the internal data bus of the flash memory 500 has a bus width of 16 bits, in consideration of the operating speed of 16-bit buses. In this example, the page buffer circuit 520 is constructed so that it is compatible with 16 bit buses. In data input to the flash memory 500, data of the upper byte (High Byte) of the beginning address 1006H is Data0, data of the lower byte (Low Byte) of the end address 1016H is Data31, and the amount is 32 bytes.

As described above, data is stored into the page buffer circuit 520 and the page buffer circuit 520 operates using a 16 bit bus. Therefore, when data is read from the page buffer circuit 520, the output data has a structure as shown in FIG. 11C corresponding to the internal addresses. However, the lower byte of the address 1006H and the upper byte of the address 1016H are not supposed to be written into memory cells. A process for preventing the data from being written is required.

FIG. 12 is a flowchart for explaining write procedures in the flash memory 500 which can be controlled depending on the data bus width of both the byte mode and the word mode. Note that although various settings, verification operations, voltage controls, and the like are actually required in addition to a procedure described below, description is omitted for procedures which are not directly involved in write processes.

Processes in steps 7101 to 7103 are similar to steps 7001 to 7003 shown in the flowchart of FIG. 10.

In step 7104, it is determined whether or not data is to be written into the page buffer circuit 520 in the byte mode or in the word mode. When the writing to the page buffer circuit 520 is performed in the word mode, data is written into memory cells on a word-by-word basis, so that it is not the case that only one of a lower byte and an upper byte is written into the page buffer circuit 520. For the word mode, the process goes to step 7111 where writing is performed.

On the other hand, when data is written into the page buffer circuit 520 in the byte mode, writing is performed on a byte-by-byte basis. For the byte mode, a lower byte and an upper byte are treated with a process for determining the validity of data and, if necessary, prohibiting writing thereof in step 7105 to 7110.

Among these steps, in steps 7105 to 7107, when writing to the page buffer circuit 520 is started from an upper byte, write data at a lower byte corresponding to the upper byte is prohibited from being written into the memory array 550 if data write is not required.

Similarly, in steps 7108 to 7110, when writing to the page buffer circuit 520 is ended at a lower byte, write data at an upper byte corresponding to the lower byte is prohibited from being written into the memory array 550 if data write is not required.

To realize such writing prohibition, it is conceived to mask part of data read from the page buffer circuit 520 in step 7103, for example. Alternatively, the write control circuit 540 (see FIG. 9) is provided with a section for enabling or disabling writing on a byte-by-byte basis and the enable signal or the disable signal is controlled so as to realize the writing prohibition process.

According to the above-described processes, when writing data to memory cells is performed in step 7111, unnecessary data of upper byte/lower byte data read from the page buffer circuit 520 can be prohibited from being written.

Steps 7112 and 7113 after completion of writing to a target address are similar to steps 7005 and 7006 in the flowchart of FIG. 10.

Thus, it is possible to write all data stored in the page buffer circuit 520 into the memory array 550 in accordance with the byte mode and the word mode.

Next, another example of the case where writing data to the flash memory 500 having the page buffer circuit 520 is controlled in accordance with a plurality of data bus widths, is provided, in which the flash memory has a page mode reading function and the flash memory has multi-value memory cells in which three or more values can be set as data (multi-value flash memory). Here, similar to the above description, a data write operation of the flash memory in which the byte mode and the word mode can be arbitrarily selected by a user will be described.

In general, it takes a longer time to read data from a multi-value memory cell than to read data from a two-value memory cell which can store two values as data. Therefore, in order to prevent a reduction in the processing performance of a system having a flash memory, a read circuit for the flash memory is often provided with a page mode reading function for reading data simultaneously from a plurality of memory cells. In some cases, in order to speed up writing to a multi-value memory cell or the like, a page buffer circuit for temporarily storing data to be written into a memory cell is provided.

In multi-value flash memories, a write operation includes a plurality of steps for writing values in a stepwise manner. In each step, based on data currently stored in a memory cell, data to be stored, and a plurality of threshold values of a memory cell, it is determined whether or not writing data to a memory cell (applying a write pulse) is performed, where the strength of the write pulse has to be regulated.

Moreover, in multi-value flash memories, a write operation includes a plurality of steps and the strength of a data write pulse to a single memory cell is smaller as compared to a two-value memory cell. Therefore, it is possible that writing can be simultaneously performed on a number of memory cells. To this end, it is conceived that write data is temporarily stored in a write register. Hereinafter, a description will be given of an exemplary multi-value flash memory in which it is possible to simultaneously write data to the same number of memory cells as the number of memory cells which can be simultaneously read by a page mode reading function.

FIG. 13 is a flowchart for explaining a write procedure in a multi-value flash memory which can be controlled in accordance with the data bus widths of both the byte mode and the word mode. Note that here a single cycle of multi-value write procedures is performed. In actual situations, similar processes have to be repeated. Further, although various settings, verification operations, voltage controls, and the like are actually required in addition to a procedure described below, description of a procedure which is not directly involved in a write operation is omitted.

In step 7201, all data is cleared from the write register. Writing is prohibited for a memory cell(s) in addition to memory cell(s) explicitly specified as those to be subjected to writing.

Next, in step 7202, the memory array 550 is set to the read mode. When multi-value memory cells are used, whether or not writing is performed depends on the current states of the memory cells, data to be written into the memory cells, and the threshold voltage of the memory cells. Therefore, it is necessary to read data from the memory cell before writing.

Next, in step 7203, the internal address of the flash memory 500 is set to a beginning address from which data is written.

Next, in step 7204, page reading is performed. As a result, a page of current memory cell states is read out.

Next, in step 7205, data to be written into the current internal address is read from the page buffer circuit 520 (see FIG. 9).

Next, in step 7206, data read from the page buffer circuit 520 in step 7205 are compared with the states of the respective memory cells read in step 7204 to determine whether or not it is necessary to apply a write pulse to the individual memory cells, and write data is prepared.

Next, in step 7207, when writing to the page buffer circuit 520 is performed in the byte mode, there is the possibility that writing to memory cells corresponding to only one of upper byte data and lower byte data is prohibited. Therefore, in steps 7210 to 7215, only one of lower byte data and upper byte data is treated with a process for prohibiting writing thereof. Steps 7210 to 7215 are similar to steps 7105 to 7110 in the flowchart of FIG. 12.

Whether or not the current internal address is the end address of write data is determined. When the current internal address is the end address, the process goes to step 7216. When the current internal address is not the end address, the process goes to step 7209.

In step 7208, when the current internal address is the end address of write data or the end address of a page, the process goes to step 7216. When the current internal address is not the end address of write data or the end address of a page, the process goes to step 7209 where the internal address is updated by an internal address updating section (e.g., the internal address is incremented by an incrementing section), and the process returns to step 7205. When the internal address reaches the end address of write data or the end address of a page, this process loop branches from step 7213 and step 7214 to go to step 7215 or branches from step 7208, thereby going to step 7216.

In step 7216, all required write data have been prepared, and it is determined whether or not applying a write pulse is required. When there is no memory cell requiring writing, the write process is ended. When there is a memory cell(s) requiring writing, in step 7217 the memory array 550 is set to the write mode, and thereafter, in step 7218, writing is performed. By the above-described processes, a write pulse can be applied to memory cells.

In the above-described conventional flash memory 500 having the page buffer circuit 520, there may be data stored in the page buffer circuit 520 which need not be written into memory cells. Therefore, it is necessary to determine whether or not data read from the page buffer circuit 520 is valid write data.

Thus, in the conventional flash memory 500, it is necessary to process data read from the page buffer circuit 520 by the WSM circuit 530 so as to prohibit unnecessary data from being written into memory cells. In this case, however, the control of the WSM circuit 530 is complicated, resulting in a reduction in the processing speed.

This problem is particularly significant in semiconductor memory devices, such as a flash memory which can be controlled in accordance with a plurality of data bus widths, a multi-value flash memory having a page mode reading function, and the like.

SUMMARY OF THE INVENTION

According to an aspect of the present invention, a semiconductor memory device is provided, which comprises a memory array comprising a plurality of memory cells; a page buffer section for temporarily storing data to be written into the memory array; and a masking section for masking at least a portion of data read from the page buffer section.

In one embodiment of this invention, the masking section masks the portion of the data based on a data bus width in the semiconductor memory device.

In one embodiment of this invention, the masking section comprises a comparison section for comparing a value of an address of the memory array with a value of at least one of a beginning address and an end address of the memory array, when the data is read from the page buffer section. Whether or not the data is masked is determined based on a result of the comparison by the comparison section.

In one embodiment of this invention, the masking section comprises a matching detection section for determining whether or not an address of the memory array is equal to at least one of a beginning address and an end address of the memory array, when the data is read from the page buffer section. Whether or not the data is masked is determined based on a result of the matching by the matching detection section.

In one embodiment of this invention, the masking section comprises a counter section for counting the number of pieces of data to be written into the memory array. Whether or not the data is masked is determined based on a result of the counting by the counter section.

In one embodiment of this invention, the masking section comprises a deactivation section for deactivating a portion of the data read from the page buffer section.

In one embodiment of this invention, each of the plurality of memory cells is a multi-value memory cell capable of storing at least three values. The semiconductor memory device comprises a page mode read section for simultaneously reading some of the plurality of memory cells.

Functions of the present invention will be described below.

The semiconductor memory device of the present invention is provided with a masking section for masking at least a portion of data read from a page buffer section. The term "mask" section an act of disabling data to be written. For example, in an ETOX-type flash memory where the delete state is defined as data '1' and the write state is defined as data '0', masking section changing data in a memory cell to data '1'. As used herein, such an act is referred to as "mask" and a function of masking data is referred to as a "masking function".

According to the present invention, in semiconductor memory devices, such as a flash memory capable of being controlled in accordance with a plurality of data bus widths, a multi-value flash memory having a page mode read function, and the like, data that need not be written into memory cells can be masked by the masking section when the data is read from a page buffer section. Therefore, it is not necessary to process data read from a page buffer circuit using a WSM circuit, as is different from conventional flash memories. Thus, it is possible to avoid the complicated control of the WSM circuit.

In order to determine the necessity of masking, a result of comparison between an address of a memory array and at least one of a beginning address and an end address of the memory array can be used.

Alternatively, in order to determine the necessity of masking, a result of determination whether or not an address of a memory array is equal to at least one of a beginning address and an end address of the memory array can be used.

Further, the result of counting the number of pieces of data to be written into memory cells can be used.

Furthermore, by providing a deactivation section for deactivating the above-described masking function, it is possible to use a page buffer circuit in a manner similar to conventional manners by deactivating the masking function when the masking function is not required, as in a flash memory which is controlled by using a single data bus width.

Thus, the invention described herein makes possible the advantage of providing a semiconductor memory device which can be controlled so that data which is stored in a page buffer circuit and need not be written, is prohibited from being written into a memory array, where the write control of a WSM circuit is simplified.

These and other advantages of the present invention will become apparent to those skilled in the art upon reading and understanding the following detailed description with reference to the accompanying figures.

BRIEF DESCRIPTION OF THE DRAWINGS

FIG. 4A is a table showing a structure of data to be written into a semiconductor memory device.

FIGS. 4B and 4C are tables showing a structure of data to be written into a semiconductor memory device, particularly showing data read from a page buffer circuit, which are masked by a page buffer mask circuit, in the semiconductor memory devices of Embodiments 1 and 2 of the present invention, respectively.

FIG. 11A is a table showing an exemplary structure of data to be written into memory cells.

FIG. 11B is a table showing data stored in a page buffer circuit.

FIG. 11C is a table showing data to be written into memory cells, which has been read from a page buffer circuit.

DESCRIPTION OF THE PREFERRED EMBODIMENTS

Hereinafter, the present invention will be described by way of illustrative examples with reference to the accompanying drawings.

Flash memories will be described below as examples of the semiconductor memory device of the present invention, though the semiconductor memory device of the present invention is not limited to a flash memory.

Although only write operations using a page buffer circuit will be described below, read operations, erase operations, and the like are performed in conventional manners.

(Embodiment 1)

Figure 1:
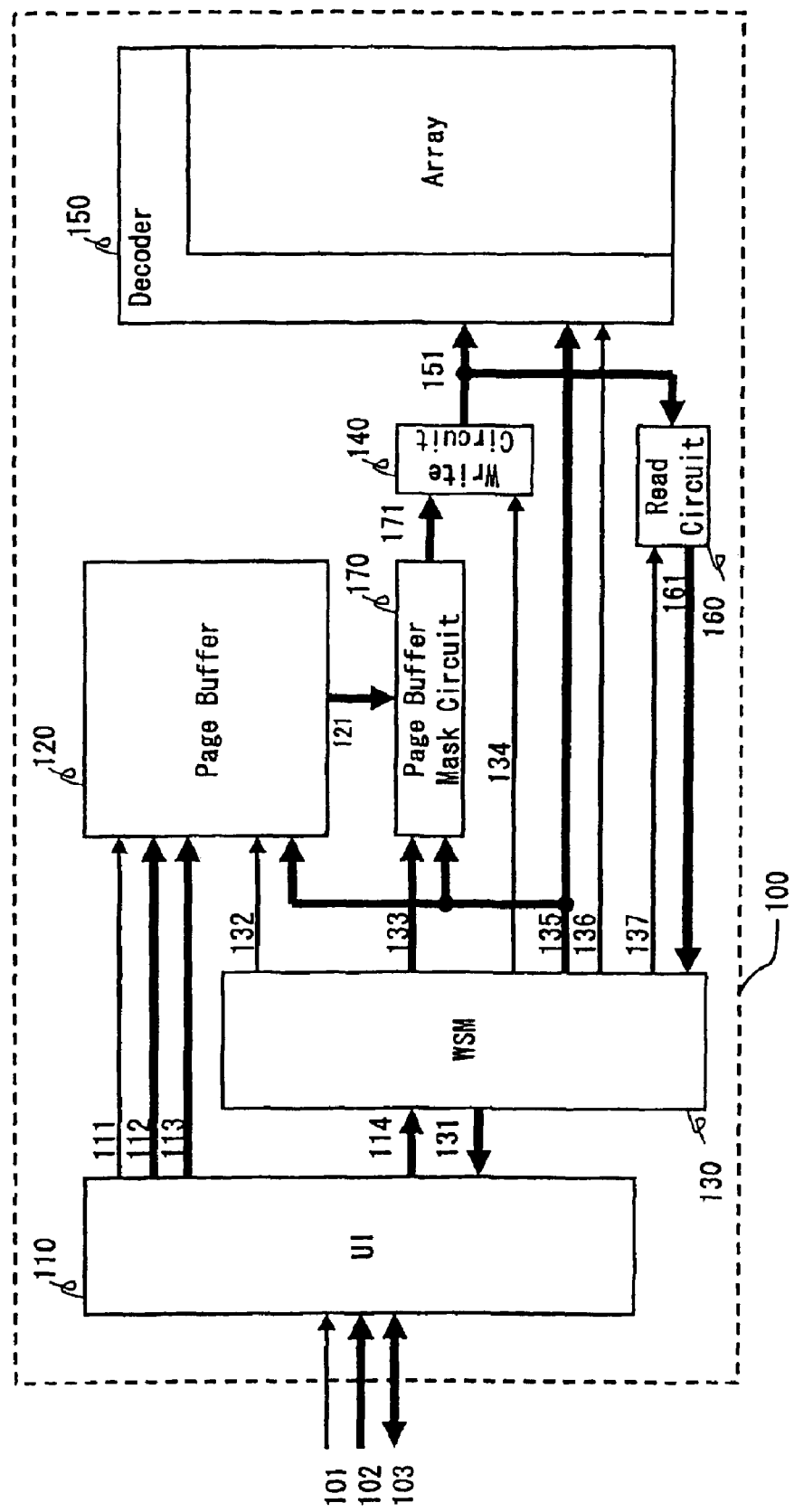
FIG. 1 is a block diagram showing a semiconductor memory device according to Embodiment 1 of the present invention.

FIG. 1 is a block diagram showing a semiconductor memory device according to Embodiment 1 of the present invention. The semiconductor memory device of FIG. 1 is a flash memory 100 comprising a page buffer circuit 120. FIG. 1 shows portions of the flash memory 100 which are involved in write operations.

The flash memory 100 comprises a UI circuit 110, a page buffer circuit 120, a WSM circuit 130, a write control circuit 140, a memory array 150, a read circuit 160, and a page buffer mask circuit 170.

This flash memory 100 receives and outputs external control signals, address signals, and data signals from and to the outside via a control bus 101, an address bus 102 and a data bus 103, respectively.

In the flash memory 100, a write operation using the page buffer circuit 120 is performed in the following manner.

When a control signal indicating a write operation, an address signal indicating a write address, and a data signal indicating data are supplied from the outside via the control bus 101, the address bus 102, and the data bus 103, respectively, to the flash memory 100, the UI circuit 110 interprets the contents of these signals. Thereafter, the UI circuit 110 supplies a control signal via a control bus 111 to the page buffer circuit 120, which instructs the page buffer circuit 120 to store write data to be written into memory cells contained in the memory array 150.

When a control signal is supplied from the UI circuit 110 via the control bus 111 to the page buffer circuit 120, data indicated by a data signal transferred via the data bus 113 is stored at an address indicated by an address signal transferred via an address bus 112. When all data has been stored in the page buffer circuit 120, a control signal indicating the start of a write operation is supplied from the UI circuit 110 via a control bus 114 to the WSM circuit 130.

When a control signal is supplied to the WSM circuit 130 from the UI circuit 110 via the control bus 114, the WSM circuit 130 supplies a control signal indicating data read and a read address signal via a control bus 132 and an address bus 135, respectively, to the page buffer circuit 120.

As used herein, an address signal is a signal indicating an internal word address at which current write data is written.

In accordance with these signals, stored data is read from the page buffer circuit 120, and the read data is supplied via a data bus 121 to the page buffer mask circuit 170. As used herein, the page buffer mask circuit 170 functions as a mask portion for masking at least a portion of data read out from the page buffer circuit 120.

Further, a control signal is supplied from the WSM circuit 130 via a control bus 133 to the page buffer mask circuit 170.

The page buffer mask circuit 170 masks a portion of data output from the page buffer circuit 120 based on a control signal supplied via the control bus 133, if required, in order to prohibit such a portion of data from being written into the memory array 150. Such partially masked data is supplied via a data bus 171 to the write control circuit 140.

Note that a control signal supplied from the WSM circuit 130 via the control bus 133 to the page buffer mask circuit 170, includes, for example, a signal indicating a beginning word address at which writing to the memory array 150 is performed, a signal indicating an end word address at which writing to the memory array 150 is performed, a signal indicating the number of pieces of data which is written into the memory array 150, and a signal indicating the width of data to be written into the memory array 150.

In an alternative structure, the control signal may be output from the UI circuit 110 to the page buffer mask circuit 170 (not shown).

Further, an address signal and a control signal are supplied from the WSM circuit 130 via the address bus 135 and the control bus 136, respectively, to the memory array 150.

The memory array 150 comprises a decoder. The address signal and the control signal are decoded by the decoder, so that a word line and a bit line corresponding to a memory cell to which data is to be written is selected; the desired memory cell is selected; and the memory cell is set in a write mode.

Further, the write control circuit 140 is supplied with a control signal, which instructs the write control circuit 140 to write data into memory cells in the memory array 150, via a control bus 134 from the WSM circuit 130.

When the write control circuit 140 is supplied with a data signal indicating a write data structure via the data bus 171 from the page buffer mask circuit 170 and a control signal via the control bus 134 from the WSM circuit 130, the write control circuit 140 controls a bit signal which is to be transferred via a bit line bus 151, and a write operation is performed on selected memory cells contained in the memory array 150.

After the write operation is performed, when a verification operation for verifying whether or not the memory cell has reached a desired threshold voltage is required, a read operation is performed on the memory cell and the read circuit 160 senses a current flowing through a bit line to verify whether or not a voltage corresponding to the sensed current reaches the threshold voltage.

In this verification operation, an address signal and a control signal are supplied from the WSM circuit 130 to the memory array 150 via the address bus 135 and the control bus 136, respectively, so that a memory cell for which a write operation has been performed is set into a read mode.

In the read circuit 160, when a control signal is supplied from the WSM circuit 130 via a control bus 137, data is read from the memory cell and the read data is output via a data bus 161 to the WSM circuit 130.

Note that a circuit structure for utilizing the result of the verification operation is not described in detail, since it is not directly related to the present invention. Though, for example, such a structure can be realized by providing a circuit in which data to be written into the memory array 150, which is supplied via the data bus 171, is compared with data read after writing, which is supplied via the data bus 161, to determine whether or not writing has been completed. The result of the determination is supplied from such a circuit to the WSM circuit 130.

The UI circuit 110 can utilize the state of the memory array 150 transmitted via a control bus 131 to determine the state transition of the memory array 150, and output the result via a data bus 103 to the outside.

In the flash memory 100, a series of the above-described operations are repeated until all data stored in the page buffer circuit 120 has been written into the memory array 150.

Hereinafter, an exemplary structure of the page buffer mask circuit 170 in the flash memory 100, which realizes a masking function, will be described.

Figure 2:
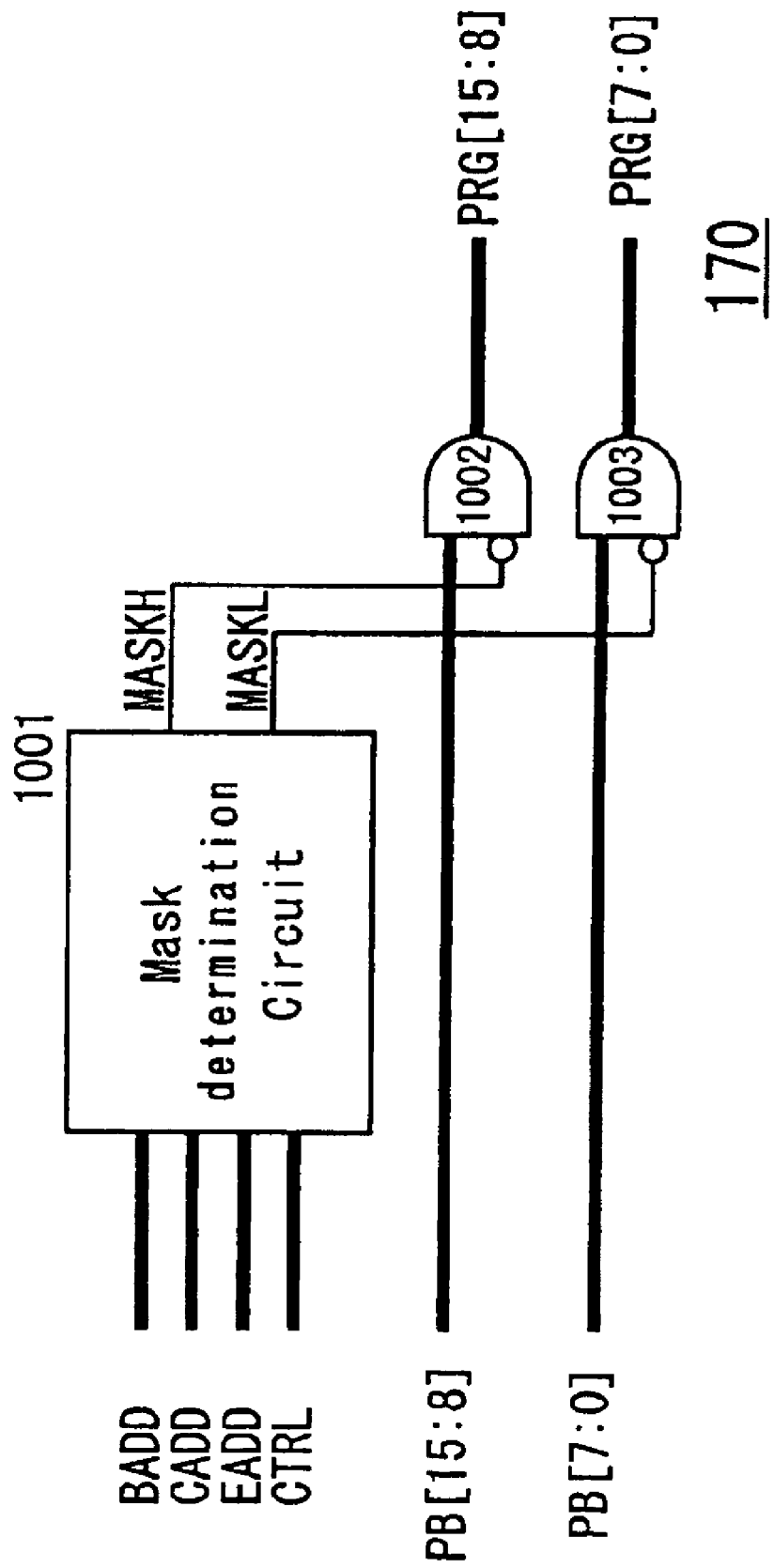
FIG. 2 is a circuit diagram showing a page buffer mask circuit in the semiconductor memory device of Embodiment 1 of the present invention.

FIG. 2 is a circuit diagram showing the page buffer mask circuit 170 in the semiconductor memory device according to Embodiment 1 of the present invention.

The page buffer mask circuit 170 comprises a mask determination circuit 1001, an AND circuit 1002, and an AND circuit 1003.

The page buffer mask circuit 170 can handle data both on a byte-by-byte basis (one byte is equal to 8 bits), which is referred to as a byte mode, and on a word-by-word basis (one word is equal to 16 bits), which is referred to as a word mode. The mask determination circuit 1001 controls a masking function which masks an upper byte and a lower byte.

The mask determination circuit 1001 is supplied with a control signal and an address signal CADD from the WSM circuit 130 via the control bus 133 and the address bus 135. The control signal includes a signal BADD, a signal EADD, and a signal CTRL.

The address signal CADD indicates an internal word address at which current write data is written. This address is hereinafter referred to as an internal word address CADD.

The signal BADD indicates a beginning word address at which writing to the memory array 150 is performed. This address is hereinafter referred to as a beginning word address BADD.

The signal EADD indicates an end word address at which writing to the memory array 150 is performed. This address is hereinafter referred to as an end word address EADD.

The signal CTRL includes a signal indicating the least significant byte of data representing the number of pieces of data to be written into the memory array 150, a signal for determining whether a current mode is the byte mode or the word mode, and a signal indicating whether or not writing to the memory array 150 is started from upper byte data.

Note that these signals supplied to the mask determination circuit 1001 may vary depending on the specification, configuration, or the like of the mask determination circuit 1001.

Referring to FIG. 1, the page buffer mask circuit 170 is supplied with a data signal indicating data, which has been read from the page buffer circuit 120, via a data bus 121. In the data signal supplied from the page buffer circuit 120, a signal indicating upper byte data is referred to as a signal PB[15:8], while a signal indicating lower byte data is referred to as a [7:0].

A control signal MASKH output from the mask determination circuit 1001 is inverted and input to one input terminal of the AND circuit 1002. The signal PB[15:8] is input to the other input terminal of the AND circuit 1002.

Another control signal MASKL output from the mask determination circuit 1001 is inverted and input to one input terminal of AND circuit 1003. The signal PB[7:0] is input to the other terminal of the AND circuit 1003.

When the mask determination circuit 1001 masks the upper byte of data output from the page buffer circuit 120, the mask determination circuit 1001 raises the control signal MASKH to a HIGH level. When masking the lower byte of data, the mask determination circuit 1001 raises the control signal MASKL to the HIGH level. On the other hand, when data is not masked, the mask determination circuit 1001 causes both the control signal MASKH and the control signal MASKL to go to a LOW level.

A data signal PRG[15:0] output from the page buffer mask circuit 170 via the data bus 171 is output without masking the data signal PB[15:0], when both the control signal MASKH and the control signal MASKL are at the LOW level.

When the control signal MASKH is at the HIGH level, all bits of the data signal PRG[15:8] output from the AND circuit 1002 are converted to the LOW level. When the control signal MASKL is at the HIGH level, all bits of [7:0] output from the AND circuit 1003 are converted to the LOW level. Here, a write control system comprising the write control circuit 140 is constructed such that when the data signal PRG[15:0] is at the HIGH level, a write pulse is applied to a memory cell. Thus, the page buffer mask circuit 170 can mask the upper byte/lower byte of data to be written into memory cells in accordance with an output (determination result) of the mask determination circuit 1001.

Figure 3A:
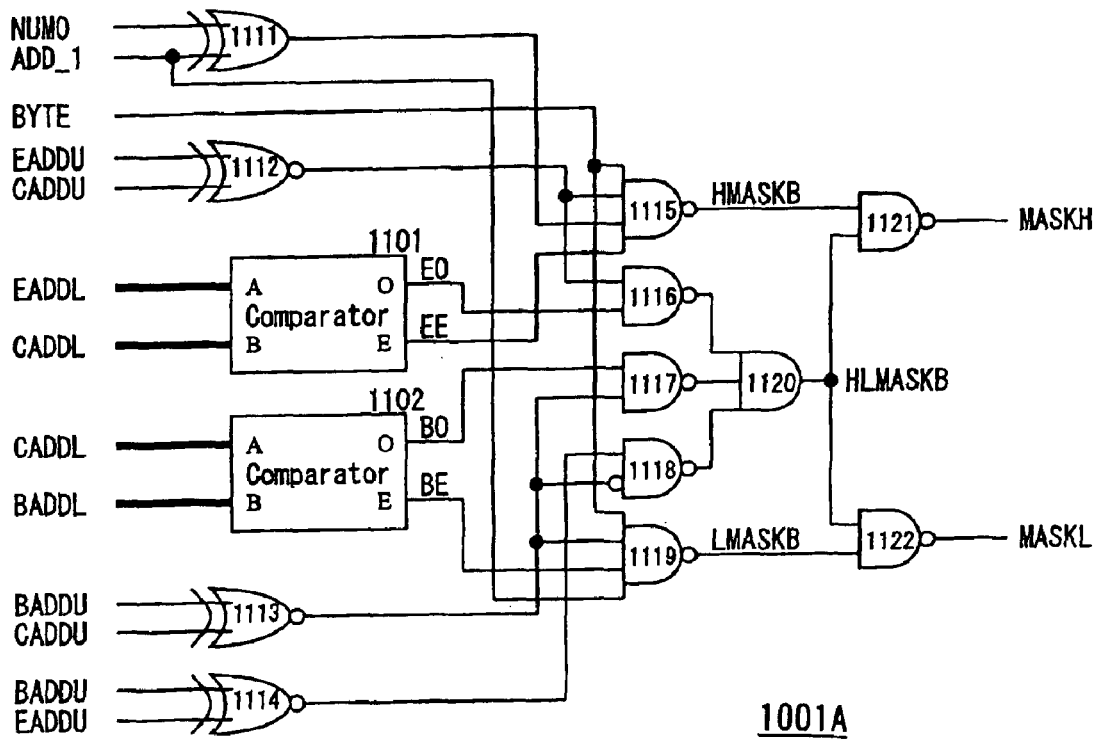
FIGS. 3A to 3C are circuit diagrams showing specific examples of a mask determination circuit of FIG. 2.
Figure 3B:
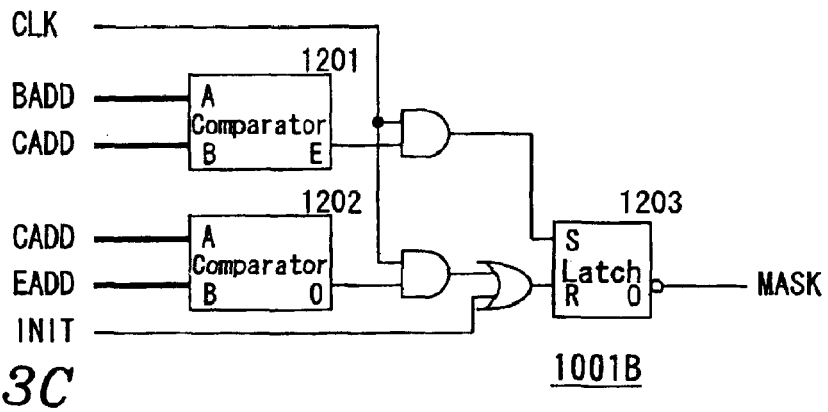
Figure 3C:
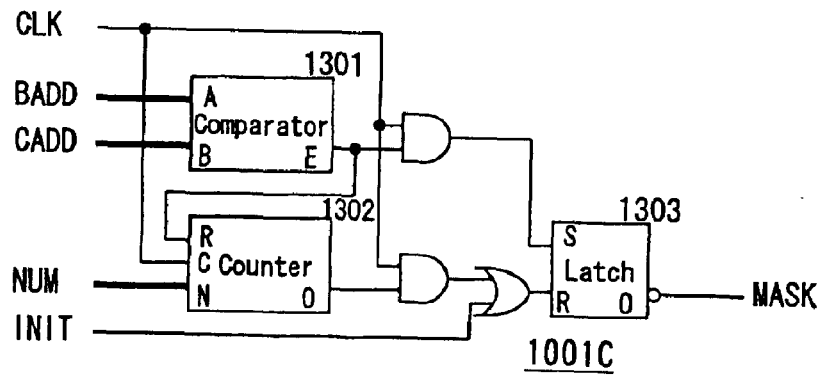

FIGS. 3A to 3C are specific circuit diagrams showing the mask determination circuit 1001 of FIG. 2.

FIG. 3A is a circuit diagram showing a mask determination circuit 1001A as an example of the above-described mask determination circuit 1001.

The mask determination circuit 1001A comprises an address comparison circuit 1101 and 1102, an XOR circuit 1111, XNOR circuits 1112 to 1114, NAND circuits 1115 to 1119 and 1121 to 1122, an AND circuit 1120.

The address comparison circuits 1101 and 1102 function as a comparator for comparing two addresses. The address comparison circuits 1101 and 1102 each may be constructed with known circuits. Here, the internal structure of the address comparison circuits 1101 and 1102 are not described in detail.

The address comparison circuit 1101 comprises an input terminal A, an input terminal B, an output terminal E, and an output terminal O.

The address comparison circuit 1101 receives a signal EADDL via the input terminal A and a signal CADDL via the input terminal B.

The signal EADDL indicates the lower bits of an end word address except for the highest bit (the most significant bit), where the number of lower bits is sufficient to uniquely determine an address of the page buffer circuit 120. An address indicated by the signal EADDL is hereinafter referred to as an address EADDL.

The signal CADDL indicates the lower bits of an internal word address of current write data, except for the highest bit (the most significant bit), where the number of lower bits is sufficient to uniquely determine an address of the page buffer circuit 120. An address indicated by the signal CADDL is hereinafter referred to as an address CADDL.

The address comparison circuit 1101 compares the address EADDL input via the input terminal A with the address CADDL input via the input terminal B. If the address EADDL is equal to the address CADDL, the address comparison circuit 1101 outputs a HIGH level signal via the output terminal E. If the address EADDL is smaller than the address CADDL, the address comparison circuit 1101 outputs a HIGH level signal via the output terminal O.

The address comparison circuit 1102 comprises an input terminal A, an input terminal B, an output terminal E, and an output terminal O.

The address comparison circuit 1102 receives the signal CADDL via the input terminal A and a signal BADDL via the input terminal B.

The signal BADDL indicates the lower bits of a beginning word address BADD except for the highest bit (the most significant bit), where the number of lower bits is sufficient to uniquely determine an address of the page buffer circuit 120. An address indicated by the signal BADDL is hereinafter referred to as an address BADDL.

The address comparison circuit 1102 compares the address CADDL input via the input terminal A with the address BADDL input via the input terminal B. If the address CADDL is equal to the address BADDL, the address comparison circuit 1102 outputs a HIGH level signal via the output terminal E. If the address CADDL is smaller than the address BADDL, the address comparison circuit 1102 outputs a HIGH level signal via the output terminal O.

The XNOR circuit 1112 receives a signal EADDU and a signal CADDU.

The signal EADDU indicates the highest bit(s) of the end word address EADD. The remaining bits of the address are contained in the address EADDL. A bit indicated by the signal EADDU is hereinafter referred to as a bit EADDU.

The signal CADDU indicates the highest bit(s) of the current internal address CADD. The remaining bits of the address are contained in the address CADDL. A bit indicated by the signal CADDU is hereinafter referred to as a bit CADDU.

The XNOR circuit 1113 receives a signal BADDU and the signal CADDU.

The signal BADDU indicates the highest bit(s) of the beginning word address BADD. The remaining bits of the address are contained in the address BADDL. A bit indicated by the bit BADDU is hereinafter referred to as a bit BADDU.

The XNOR circuit 1114 receives the signal BADDU and the signal EADDU.

The XOR circuit 1111 receives a signal NUM0 and a signal ADD_1.

The signal NUM0, the signal BYTE, and the signal ADD_1 are collectively represented by the signal CTRL in FIG. 2.

The signal NUM0 indicates the lowest bit (the least significant bit) of data representing the number of pieces of data to be written into memory cells by data write using the page buffer circuit 120. When an even number of pieces of data is to be written, the signal NUM0 is at a LOW level. When an odd number of pieces of data is to be written, the signal NUM0 is at a HIGH level.

The signal BYTE indicates the byte mode or the word mode. When a write operation is performed in the byte mode, the signal BYTE is at a HIGH level. When a write operation is performed in the word mode, the signal BYTE is at a LOW level.

The signal ADD_1 is at a HIGH level when writing to the memory array 150 is started from upper byte data, and is otherwise at a LOW level.

By inputting the above-described signals into the mask determination circuit 1001A, it is possible to produce the control signals MASKH and MASKL for determining whether or not a masking function is performed.

Hereinafter, the mask determination circuit 1001A shown in FIG. 3A will be described in greater detail.

An intermediate node LMASKB is provided within the mask determination circuit 1001A, which goes to a LOW level when only lower byte data is masked. An intermediate node HMASKB goes to a LOW level when only upper byte data is masked. An intermediate node HLMASKB goes to a LOW level when both upper byte data and lower byte data are masked.

When HMASKB=LOW level or HLMASKB=LOW level, the NAND circuit 1121 outputs the HIGH level control signal MASKH.

When LMASKB=LOW level or HLMASKB=LOW level, the NAND circuit 1122 outputs the HIGH level control signal MASKL.

The signal LMASKB output from the NAND circuit 1119 is at the LOW level when (1) the signal BYTE is at the HIGH level (byte mode), (2) the bit BADDU is equal to the bit CADDU (a signal output from the XNOR circuit 1113 is at the HIGH level), (3) the address CADDL is equal to the address BADDL (a signal BE output from the output terminal E of the address comparison circuit 1102 is at a HIGH level), and (4) the signal ADD_1 is at the HIGH level. In other words, the LOW level LMASKB indicates that a write operation is performed in the byte mode; the internal word address CADD of current write data is equal to the beginning word address BADD; and the write operation is started from an upper byte. In this case, since the write operation is started from the upper byte, the lower byte data of a beginning word address is masked so that the lower byte data is prohibited from being written.

The signal HMASKB output from the NAND circuit 1115 is at the LOW level when (1) the signal BYTE is at the HIGH level (byte mode); (2) the bit EADDU is equal to the bit CADDU (a signal output from the XNOR circuit 1112 is at a HIGH level); (3) the address CADDL is equal to the address EADDL (a signal EE output from the output terminal E of the address comparison circuit 1101 is at a HIGH level); and (4) the signal level of the signal ADD_1 is not equal to the signal level of NUM0 (an output of the XOR circuit 1111 is at a HIGH level). In other words, the LOW level HMASKB indicates that the write operation is performed in the byte mode; the internal word address CADD of current write data is equal to the end word address EADD; and the write operation is ended at a lower byte. In this case, since the write operation is ended at the lower byte, the upper byte of data at the end word address is masked to be prohibited from being written.

The signal HLMASKB output from the AND circuit 1120 is at the LOW level when one of the following three conditions is satisfied.

The first condition is that a signal output NAND circuit 1116 is at a LOW level. This condition is satisfied when the bit EADDU is equal to the bit CADDU (a signal output from the XNOR circuit 1112 is at the HIGH level) and the address EADDL is smaller than the address CADDL (the signal EO output from the output terminal O of the address comparison circuit 1101 is at the HIGH level). When the first condition is satisfied, the current write address exceeds the end address, so that current write data is masked so that both the upper and lower bytes of the data are prohibited from being written.

The second condition is that a signal output from the NAND circuit 1117 is at a LOW level. This condition is satisfied when the bit BADDU is equal to the bit CADDU (a signal output from the XNOR circuit 1113 is at the HIGH level), and the address BADDL is greater than the address CADDL (the signal BO output from the output terminal O of the address comparison circuit 1102 is at the HIGH level). When the second condition is satisfied, the current write address is smaller than the beginning address, so that current write data is masked so that both the upper and lower bytes of the data are prohibited from being written.

The third condition is that a signal output from the NAND circuit 1118 is at a LOW level. This condition is satisfied when the bit BADDU is equal to the bit EADDU (a signal output from the XNOR circuit 1114 is at a HIGH level) and the bit BADDU is not equal to the bit CADDU (the signal output from the XNOR circuit 1113 is at a LOW level). When the third condition is satisfied, the current write address is not within the normal allowable address range, so that current write data is masked so that both the upper and lower bytes of the data are prohibited from being written.

By using the mask determination circuit 1001A shown in FIG. 3A, it is possible to determine whether or not masking of upper byte data or lower byte data is required.

Hereinafter, the control of the masking function using the mask determination circuit 1001A (FIG. 3A) in the flash memory 100 of Embodiment 1 of the present invention, will be described with reference to FIG. 4.

FIG. 4A shows a relationship between addresses of the memory array 150 indicated by address signals input to the flash memory 100 (FIG. 1) and data indicated by data signals, which is to be written into the memory array 150. FIGS. 4B and 4C show a relationship between addresses of the page buffer circuit 120 (FIG. 1) and data stored at the addresses of the page buffer circuit 120 and thereafter masked by the page buffer mask circuit 170.

FIG. 4A is a table showing addresses of the memory array 150 (Write Word Address) and data containing lower bytes (Write Data (LOW Byte)) and upper bytes (Write Data (High Byte)), indicated by address signals and data signals input to the flash memory 100, respectively.

FIG. 4B is a table showing addresses (Page Buffer Address) of the page buffer circuit 120 and data containing lower bytes (Page Buffer Data (LOW Byte)) and upper bytes (Page Buffer Data (High Byte)) stored at the addresses and thereafter masked by the page buffer mask circuit 170, in Embodiment 1.

FIG. 4C is a table showing addresses (Page Buffer Address) of the page buffer circuit 120 and data containing lower bytes (Page Buffer Data (LOW Byte)) and upper bytes (Page Buffer Data (High Byte)) stored at the addresses and thereafter masked by the page buffer mask circuit 170, in Embodiment 2. FIG. 4C is referenced in Embodiment 2 below.

FIG. 4A shows a structure of data to be written using the page buffer circuit 120 and is the same table as that of FIG. 11A.

Figure 9:
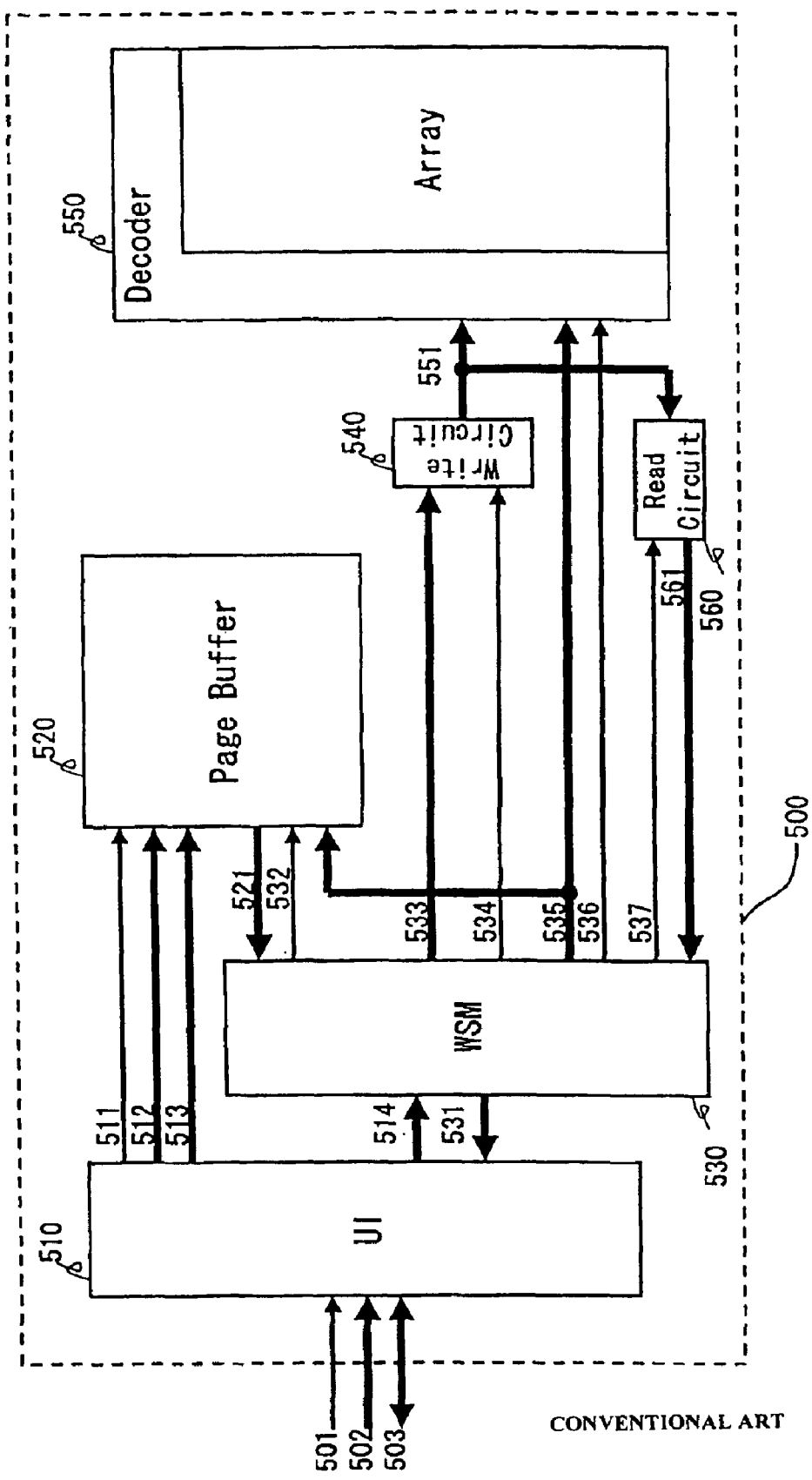
FIG. 9 is a block diagram showing a conventional semiconductor memory device.

In this data structure, a write beginning address BADD is 1006H. The internal word address CADD is set to the write beginning address and data stored in the page buffer circuit 120 is read out. Data31 is output as lower byte data and Data0 is output as upper byte data. In conventional techniques, the lower byte data of these two pieces of data is disabled by the WSM circuit 530 (FIG. 9). In Embodiment 1, the lower byte data is masked by the page buffer mask circuit 170.

Each address itself in the page buffer circuit 120 is specified by 4 bits. In order to identify the magnitude relation between the beginning word address BADD, the internal word address CADD and the end word address EADD, each address is specified by 5 bits. Therefore, the bit BADDU is the fifth bit of the beginning word address BADD, and the bit EADDU is the fifth bit of the address EADD.

When the beginning word address BADD and the internal word address CADD each correspond to an address 06H of the page buffer circuit 120, the signal BO output from the output terminal O of the address comparison circuit 1102 is at the LOW level in the mask determination circuit 1001A (FIG. 3A), and the signal BE output from the output terminal E of the address comparison circuit 1102 is at the HIGH level.

When the internal word address CADD corresponds to the address 06H of the page buffer circuit 120 and the end word address EADD corresponds to the address 16H of the page buffer circuit 120, the signal EO output from the output terminal O of the address comparison circuit 1101 is at the LOW level and the signal EE output from the output terminal E of the address comparison circuit 1101 is at the LOW level. Further, the bit BADDU is not equal to the bit EADDU; the signal NUM0 is at the LOW level; the signal BYTE is at the HIGH level; and the signal ADD_1 is at the HIGH level. Therefore, a control signal MASKH output from the mask determination circuit 1001A is at the LOW level and the control signal MASKL is at the HIGH level. Thereby, the lower byte data is masked while the upper byte data is not masked.

When data is written into the next address or an address 1007H, the signal BO goes to the LOW level and the signal BE goes to the LOW level. Both the control signal MASKH and the control signal MASKL go to the LOW level, so that neither the upper byte data nor the lower byte data is masked. Thereafter, the address is increased. Up to 1015H, neither the upper byte data nor the lower byte data is masked.

When the internal word address CADD finally reaches 1016H, the end word address EADD and the internal word address CADD correspond to the address 16H of the page buffer circuit 120. In the mask determination circuit 1001A of FIG. 3A, the signal EO output from the output terminal O of the address comparison circuit 1101 is at the LOW level and the signal EE output from the output terminal E is at the HIGH level. Since the internal word address CADD corresponds to 16H and the beginning word address BADD corresponds to 06H, the signal BO output from the output terminal O of the address comparison circuit 1102 is at the LOW level and the signal BE from the output terminal E is at the LOW level. Further, the bit BADDU is not equal to the bit EADDU; the signal NUM0 is at the LOW level; the signal BYTE is at the HIGH level; the signal ADD_1 is at the HIGH level; the control signal MASKH output by the mask determination circuit 1001A is at the HIGH level; and the control signal MASKL is at the LOW level. Thereby, the upper byte data is masked while the lower byte data is not masked.

As a result, the relationship between addresses of the page buffer circuit 120 and data read from the addresses and masked in the page buffer mask circuit 170 is shown in FIG. 4B. Therefore, in the WSM circuit 130, it is not necessary to check data widths, addresses, and the like so as to determine whether or not data write is performed on upper byte/lower byte data, thereby making it possible to simplify the write control of the WSM circuit 130.

FIG. 3B is a circuit diagram showing a mask determination circuit 1001B as an example of the mask determination circuit 1001.

Note that although the masking function of the mask determination circuit 1001B of FIG. 3B and a mask determination circuit 1001C shown in FIG. 3C will be described below, the data width is assumed to be fixed for the sake of simplicity. A signal MASK output from the mask determination circuit 1001B and 1001C, is such that all bits of data may be masked.

The mask determination circuit 1001B of FIG. 3B comprises an address comparison circuit 1201, an address comparison circuit 1202, and a latch circuit 1203.

The address comparison circuit 1201 comprises an input terminal A, an input terminal B, and an output terminal E.

The address comparison circuit 1201 receives the signal BADD via the input terminal A and the signal CADD via the input terminal B.

The address comparison circuit 1201 compares the beginning word address BADD input via the input terminal A with the internal word address CADD input via the input terminal B. When the beginning word address BADD is equal to the current internal word address CADD, a HIGH level signal is output via the output terminal E. When the beginning word address BADD is not equal to the current internal word address CADD, a LOW level signal is output via the output terminal E.

The address comparison circuit 1202 comprises an input terminal A, an input terminal B, and an output terminal O.

The address comparison circuit 1202 receives the signal CADD input via the input terminal A and the signal EADD via the input terminal B.

The address comparison circuit 1202 compares the current internal word address CADD input via the input terminal A with the end word address EADD input via the input terminal B. When the current internal word address CADD is equal to the end word address EADD, a HIGH level signal is output via the output terminal O. When the current internal word address CADD is not equal to the end word address EADD, a LOW level signal is output via the output terminal O.

The address comparison circuits 1201 and 1202 function as a matching detector.

The latch circuit 1203 comprises an input terminal S, a reset terminal R, and an output terminal O.

In the latch circuit 1203, internal latch data is set to a HIGH level by a set signal input via the input terminal S; internal latch data is reset to a LOW level by a reset signal input through the reset terminal R; the value of the internal latch data is output via the output terminal O. The mask signal MASK is a signal obtained by inverting a signal output via the output terminal O of the latch circuit 1203.

The beginning word address BADD indicated by the signal BADD input to the address comparison circuit 1201 is a beginning word address at which writing to memory cells is performed. The address CADD indicated by the signal CADD input to the address comparison circuits 1201 and 1202 is a current internal word address. The address EADD indicated by a signal EADD input to the address comparison circuit 1202 is an end word address at which writing to memory cells is performed. In this example, the beginning word address BADD and the end word address EADD are fixed and the internal word address CADD is updated by increment or the like.

A signal CLK and a signal INIT are collectively referred to as the signal CTRL in FIG. 2. The signal CLK is a clock signal. The signal CLK goes to a HIGH level after the address determination is completed by the address comparison circuits 1201 and 1202. After the latch circuit 1203 responds to the address determination, the signal CLK goes to a LOW level. The signal INIT is a signal for initializing the latch circuit 1203.

In the mask determination circuit 1001B, initially, the latch circuit 1203 is reset by the signal INIT going to the HIGH level. Thereafter, the signal INIT is transitioned back to the LOW level. In this case, the signal MASK goes to the HIGH level, thereby masking data.

After the internal word address CADD is determined, the signal CLK is transitioned to the HIGH level so that the latch circuit 1203 responds to the result of the address determination. Thereafter, the signal CLK is transitioned back to the LOW level.

Here, the internal word address is incremented to reach a write beginning word address, i.e., the internal word address CADD is equal to the beginning address BADD. In this case, the latch circuit 1203 is set, so that the signal MASK goes to the LOW level and a masking function is disabled. When the current internal word address CADD exceeds the end word address EADD, the latch circuit 1203 is reset and the signal MASK goes to the HIGH level. In this case, the masking function is enabled.

With the mask determination circuit 1001B of FIG. 3B, the masking function is disabled only for valid write addresses.

FIG. 3C is a circuit diagram showing the mask determination circuit 1001C as an example of the mask determination circuit 1001.

The mask determination circuit 1001C comprises an address comparison circuit 1301, a counter circuit 1302, and a latch circuit 1303.

The address comparison circuit 1301 comprises an input terminal A, an input terminal B, and an output terminal E.

The address comparison circuit 1301 receives the signal BADD via the input terminal A and the signal CADD via the input terminal B.

The address comparison circuit 1301 compares the beginning word address BADD input via the input terminal A with the current internal word address CADD input via the input terminal B. When the beginning word address BADD is equal to the current internal word address CADD, a HIGH level signal is output via the output terminal E. When the beginning word address BADD is not equal to the current internal word address CADD, a LOW level signal is output via the output terminal E. A signal output via the output terminal E from the address comparison circuit 1301 is used as a reset signal.

The address comparison circuit 1301 functions as a matching detector.

The counter circuit 1302 comprises a reset terminal R, a terminal C, an input terminal N, and an output terminal O.

After reset by a reset signal input via the reset terminal R, the counter circuit 1302 counts the number of rises of the signal CLK input via the terminal C, which goes from the LOW level to the HIGH level. When the number of counts exceeds a number indicated by a signal NUM input via the input terminal N, the counter circuit 1302 outputs a HIGH level signal via the output terminal O.

The counter circuit 1302 functions as a counter section which counts the number of pieces of data to be written into the memory array 150.

The latch circuit 1303 comprises a reset terminal R, a signal terminal S, and an output terminal O.

When the latch circuit 1303 receives a set signal via the signal terminal S, internal latch data is set to the HIGH level. When the latch circuit 1303 receives a reset signal via the reset terminal R, internal latch data is set to the LOW level. The latch circuit 1303 outputs a signal indicating the value of the internal latch data via the output terminal O. A mask signal MASK is a signal obtained by inverting a signal output via the output terminal O of the latch circuit 1303.

The signal BADD input to the address comparison circuit 1301 indicates a beginning word address at which writing to memory cells is performed. The signal CADD input to the address comparison circuit 1301 indicates a current internal word address. In this example, the beginning word address BADD and the end word address EADD are fixed and the current word address CADD is updated by incrementing or the like.

A signal CLK, a signal INIT and a signal NUM are collectively described by the control signal CTRL in FIG. 2. The signal CLK is a clock signal which is initially at a LOW level and alternates between the LOW and HIGH levels every time internal word address is updated. The signal INIT is an initialization signal for initializing the latch circuit 1203. The signal NUM is a signal indicating the number of pieces of data to be written.

In the mask determination circuit 1001C, initially, the signal INIT is set to a HIGH level so that the latch circuit 1303 is reset. Thereafter, the signal INIT is transitioned back to a LOW level. In this case, a signal MASK goes to a HIGH level, thereby masking data.

When the internal word address is incremented to reach the beginning word address, an address indicated by the signal CADD is equal to an address indicated by the signal BADD. In this situation, when the signal CLK goes to the HIGH level, the latch circuit 1303 is set and the signal MASK goes to the LOW level, thereby disabling the masking function.

At the same time, the counter circuit 1302 is reset. Thereafter, the counter circuit 1302 counts the number of transitions of the signal CLK from the LOW level to the HIGH level. When the number of counts is equal to a number indicated by the signal NUM, the counter circuit 1302 outputs a HIGH level signal via the output terminal O and the latch circuit 1303 is reset, so that the signal MASK goes to the HIGH level. In this case, the masking function is enabled again.

With the mask determination circuit 1001C of FIG. 3C, it is possible to disable data masking for data to be written after the internal word address reaches the beginning word address.

As described above, the necessity of masking can be determined using the address comparison circuit (address matching circuit), the counter circuit for counting the number of pieces of data, and the like.

Next, the thus-constructed flash memory 100 of Embodiment 1 will be described in terms of a write operation into memory cells using the page buffer circuit 120.

Figure 5:
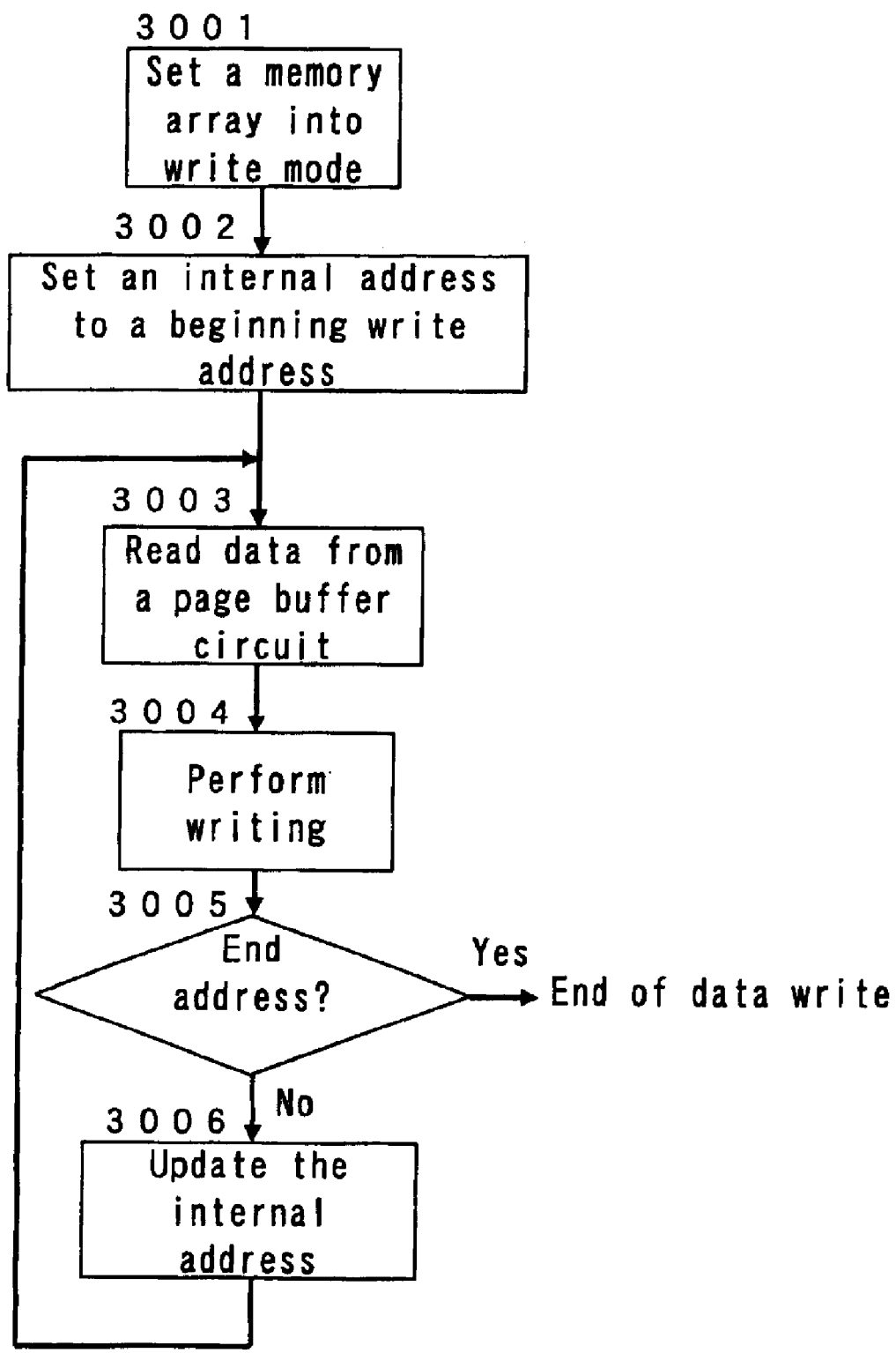
FIG. 5 is a flowchart for explaining a write operation using a page buffer circuit in the semiconductor memory device of Embodiment 1 of the present invention.

FIG. 5 is a flowchart for explaining procedures for a write operation in the flash memory 100 of Embodiment 1. Here, data write in the flash memory 100 is controlled in accordance with a plurality of data bus widths. As an example of a write operation which can be performed both in the byte mode and in the word mode, the case where data having a structure as shown in FIG. 4A is written will be described. In fact, various settings, verification operations, voltage controls and the like are required in addition to procedures described below, but the description of procedures which are not directly involved in the write operation is omitted.

Initially, in step 3001, a memory array is set to a write mode before starting a write operation.

Next, in step 3002, the internal address of the flash memory 100 is set to a beginning address at which data write is performed.

Next, in step 3003, data stored the page buffer circuit 120 is read.

Next, in step 3004, data read from the page buffer circuit 120 is written into memory cells specified by the internal address.

In step 3005, it is determined whether or not a current internal address is an end address at which data write is performed. When the current internal address is the end address, data write is ended.

When the current internal address is not the end address, in step 3006 the internal address is updated by an internal address updating section (e.g., incremented by an incrementing section) and the process goes back to step 3003. The process loop is repeated until data write to the end address is completed.

In the above-described manner, it is possible to write all data stored in the page buffer circuit 120 into memory cells.

Figure 10:
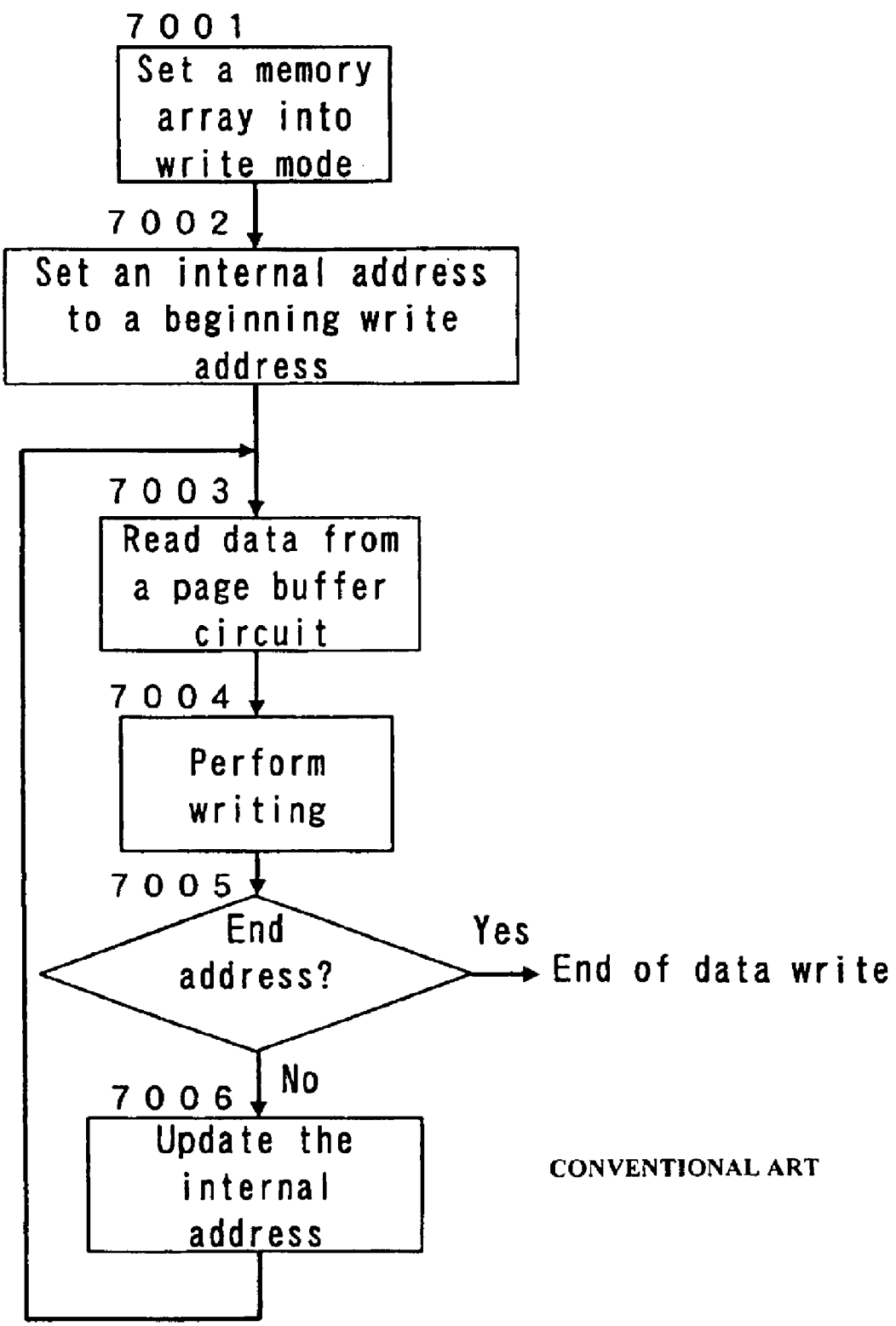
FIG. 10 is a flowchart for explaining a write operation using a page buffer circuit in the conventional semiconductor memory device.
Figure 12:
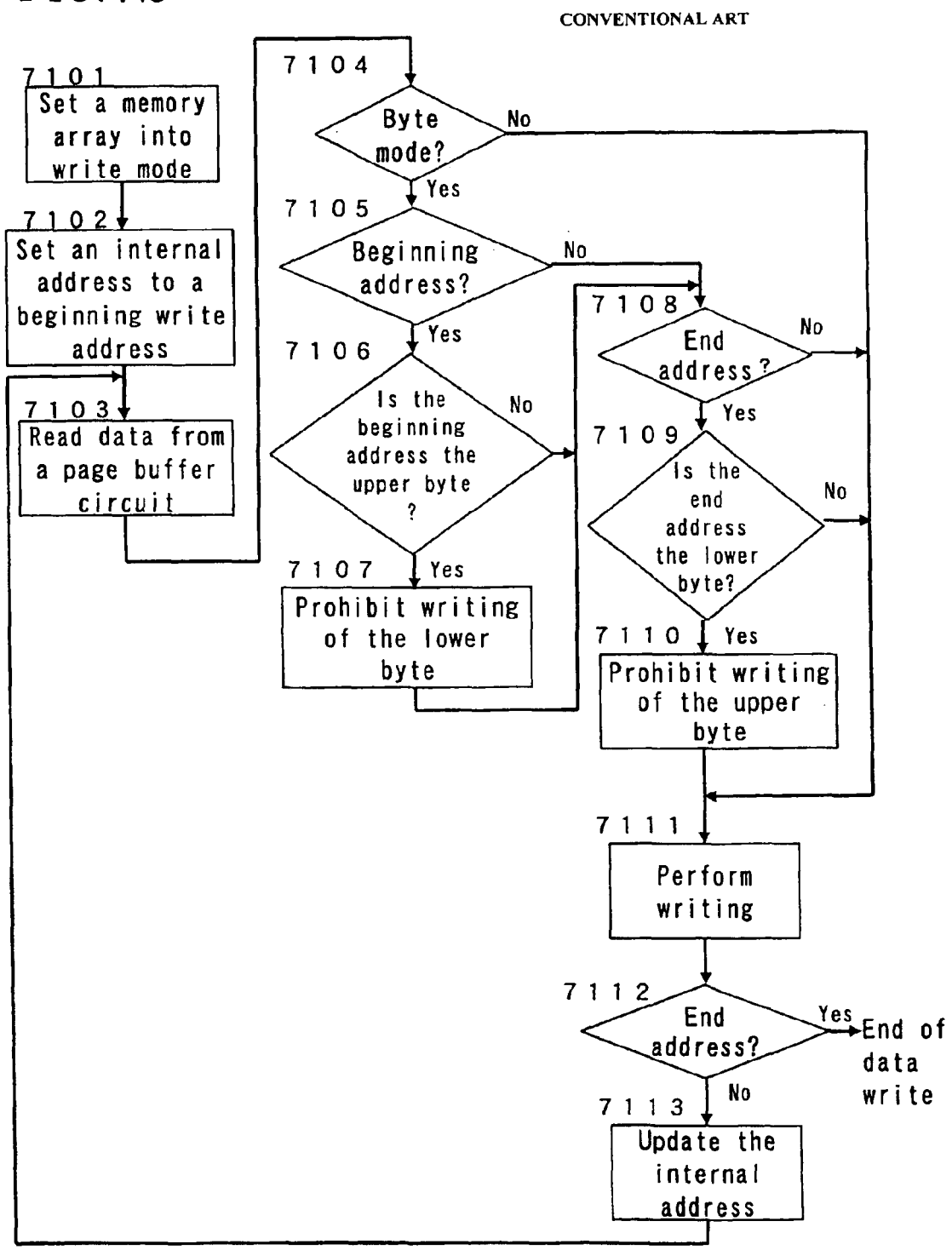
FIG. 12 is a flowchart for explaining another write operation using a page buffer circuit in the conventional semiconductor memory device.

FIG. 5 is a flowchart similar to the flowchart of a conventional technique of FIG. 10. In Embodiment 1, both the byte mode and the word mode can be handled by the above-described simple procedures. In contrast, conventional techniques require complicated control in order to handle both the word mode and the byte mode, as described using the flowchart of FIG. 12.

Hereinafter, the reason why the control in accordance with a plurality of data bus widths can be achieved with simple procedures in the flash memory of Embodiment 1, will be described with reference to FIGS. 4 and 11.

In conventional techniques, data read from a page buffer circuit 520 has a structure as shown in FIG. 1C. The lower byte (Low Byte) data at address 1006H and the upper byte (High Byte) data at address 1016H are data which should not be written into a memory array. Therefore, in conventional techniques, it is necessary to control the WSM circuit 530 in a particular fashion so as to process the unnecessary write data.

In contrast, according to Embodiment 1, data output from the page buffer mask circuit 170 (Page Buffer Read Address) has a structure as shown in FIG. 4B. The lower byte data at address 1006H and the upper byte data at address 1016H are masked to be prohibited from being written. Therefore, when all data are subjected to writing to the memory cells in the memory array 150, the unnecessary 2-byte data are prohibited from being written.

As described above, according to Embodiment 1, by providing the page buffer mask circuit 170 which masks data output from the page buffer circuit 120, it is possible to handle the control in accordance with a plurality of data bus widths without complicating the control of the WSM circuit 130.

(Embodiment 2)

Figure 6:
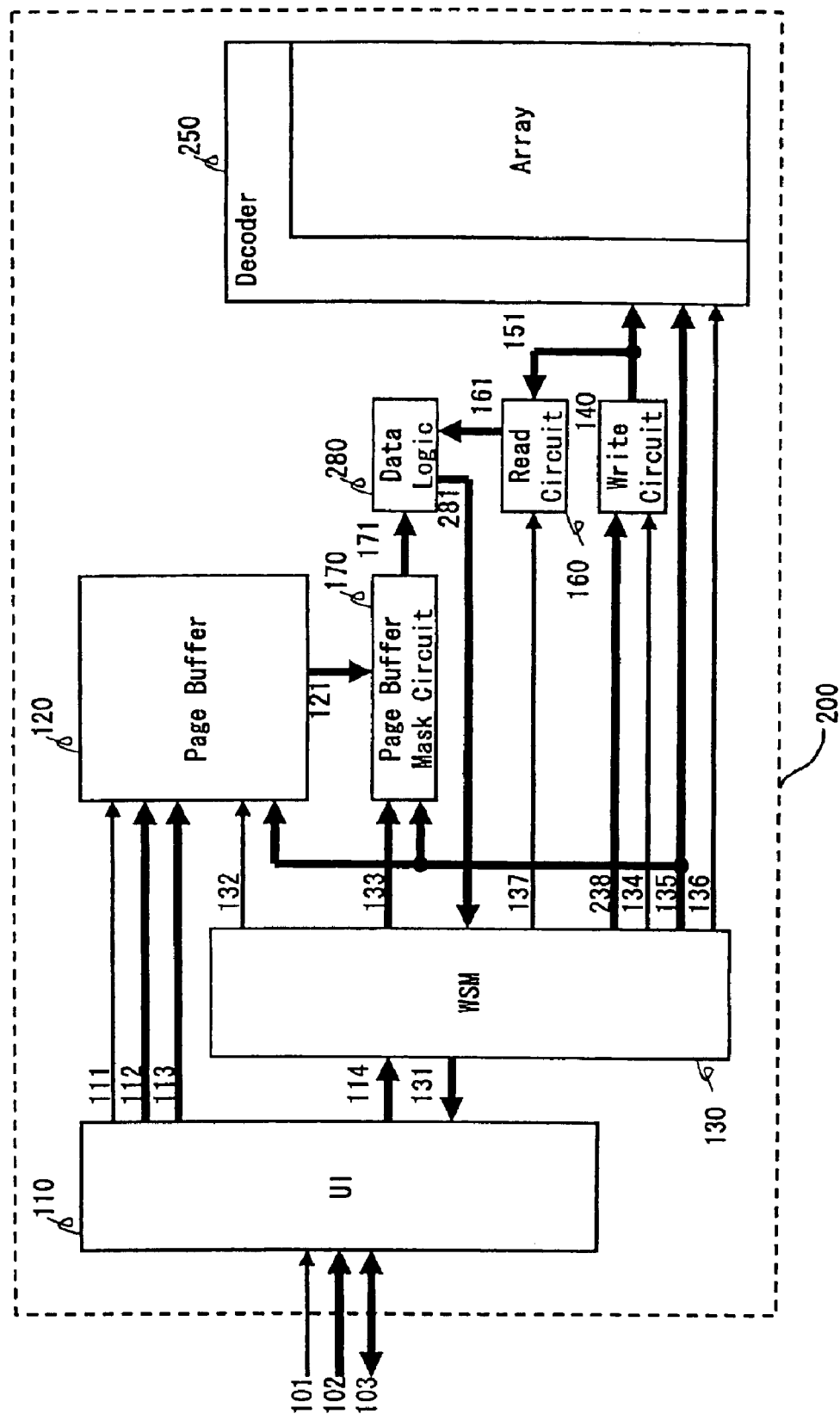
FIG. 6 is a block diagram showing a semiconductor memory device according to Embodiment 2 of the present invention.

FIG. 6 is a block diagram showing a semiconductor memory device according to Embodiment 2 of the present invention. FIG. 6 shows a flash memory 200 having a page buffer circuit as a semiconductor memory device. Portions of the flash memory 200, which are involved in writing, are shown in FIG. 6. Note like numerals indicate like parts in FIGS. 1 and 6.

The flash memory 200 is a multi-value flash memory 200.

The flash memory 200 comprises a UI circuit 110, a page buffer circuit 120, a WSM circuit 130, a write control circuit 140, a memory array 250, a read circuit 160, a page buffer mask circuit 170, and a data logic circuit 280.

In the flash memory 200, a write operation is performed using the page buffer circuit 120 as follows. Note that the description of a portion of the write operation common to the flash memory 100 of Embodiment 1 is omitted.

As compared to two-value flash memories, the multi-value flash memory 200 requires strict control of the state of a memory cell (stored charges or stored voltages) with respect to a plurality of threshold voltages. Thus, it takes a longer time to perform writing. In the multi-value flash memory 200, a write operation is performed by a plurality of separate steps, so that a data write pulse for a single memory cell is weak compared to a two-value memory cell. Therefore, it is possible to simultaneously write data into a number of memory cells. For example, in Embodiment 2, it is assumed that each memory cell in the flash memory 200 can store 4 values as data, and it is possible to write 4 words of memory cells (=64 bits=32 memory cells) simultaneously.

In multi-value memory cells, it is necessary to strictly control a write voltage to a memory cell with respect to a plurality of threshold voltages of the memory cell. Data write using a significantly higher or lower voltage than a target threshold voltage cannot be permitted. Therefore, generally, the current state of a memory cell is compared with the intended state of the memory cell so as to determine whether a write pulse is applied to the memory cell. Alternatively, the strength of the write pulse or the like is adjusted depending on the state of a memory cell. Therefore, as is different from two-value flash memories, a read operation is inevitably performed on a memory cell in order to determine a write pulse.

In the memory array 250, a memory cell specified by an internal address indicated by an address signal supplied by the WSM circuit 130 is activated by a control signal supplied via a control bus 136. The read circuit 160 reads the states of current memory cells via a bit line bus 151 in accordance with a control signal supplied via a control bus 137 from the WSM circuit 130. The read state is supplied via a data bus 261 to the data logic circuit 280. The selection of memory cells and the operation of the read circuit 160 are performed in a manner similar to that in the flash memory 100 of Embodiment 1.

Thus, in Embodiment 2, the read circuit 160 functions as a page mode read portion for multi-value write control.

Data read from the page buffer circuit 120 is supplied via a data bus 171 to the data logic circuit 280. If required, the data is masked by the page buffer mask circuit 170 in a manner similar to that in Embodiment 1.

When the data logic circuit 280 receives data indicating the state of a current memory cell and data to be eventually written, the data logic circuit 280 determines whether or not a write pulse is applied to the memory cell, or the strength of a write pulse to the memory cell, or the like. A result of the determination is supplied via a data bus 281 to the WSM circuit 130.

When the WSM circuit 130 receives the result of the determination of the data logic circuit 280 (the necessity of application of a write pulse, the strength of a write pulse to the memory cell, or the like), the WSM circuit 130 supplies write pulse data via a data bus 238 to the write control circuit 140.

In the write control circuit 140, the write pulse data supplied via the data bus 238 is stored into a write register provided therein. In Embodiment 2, it is possible to simultaneously write data into 32 memory cells. Therefore, 32 pieces of data are stored in a write register before being written into the memory cells.

As an example, it is assumed that the page buffer circuit 120 can store a maximum of 16 words or 32 bytes (i.e., 256 bits) and the amount of data which can be simultaneously read using a page read function is 4 words. By using the circuit shown in FIG. 2 (Embodiment 1) as the page buffer mask circuit 170 and any one of the circuits shown in FIGS. 3A to 3C as the mask determination circuit, it is possible to mask address regions which are not used in Embodiment 1. In this case, the relationship between data which have been read from the page buffer circuit 120 and masked by the page buffer mask circuit 170, and the addresses thereof, is shown in FIG. 4C.

The data logic circuit 280 determines the necessity of application of a write pulse, the strength of a write pulse to a memory cell, and the like, on a 4 word-by-4 word basis. For example, the upper byte data and the lower byte data at Page Buffer Read Address 17H shown in FIG. 4C are masked.

By masking all unnecessary data which are not to be written, it is possible to stop application of a write pulse, thereby making it possible to easily control a write operation.

Next, a write operation of the thus-constructed flash memory 200 of Embodiment 2 in which the page buffer circuit 120 is used to write data into memory cells, will be described.

Figure 7:
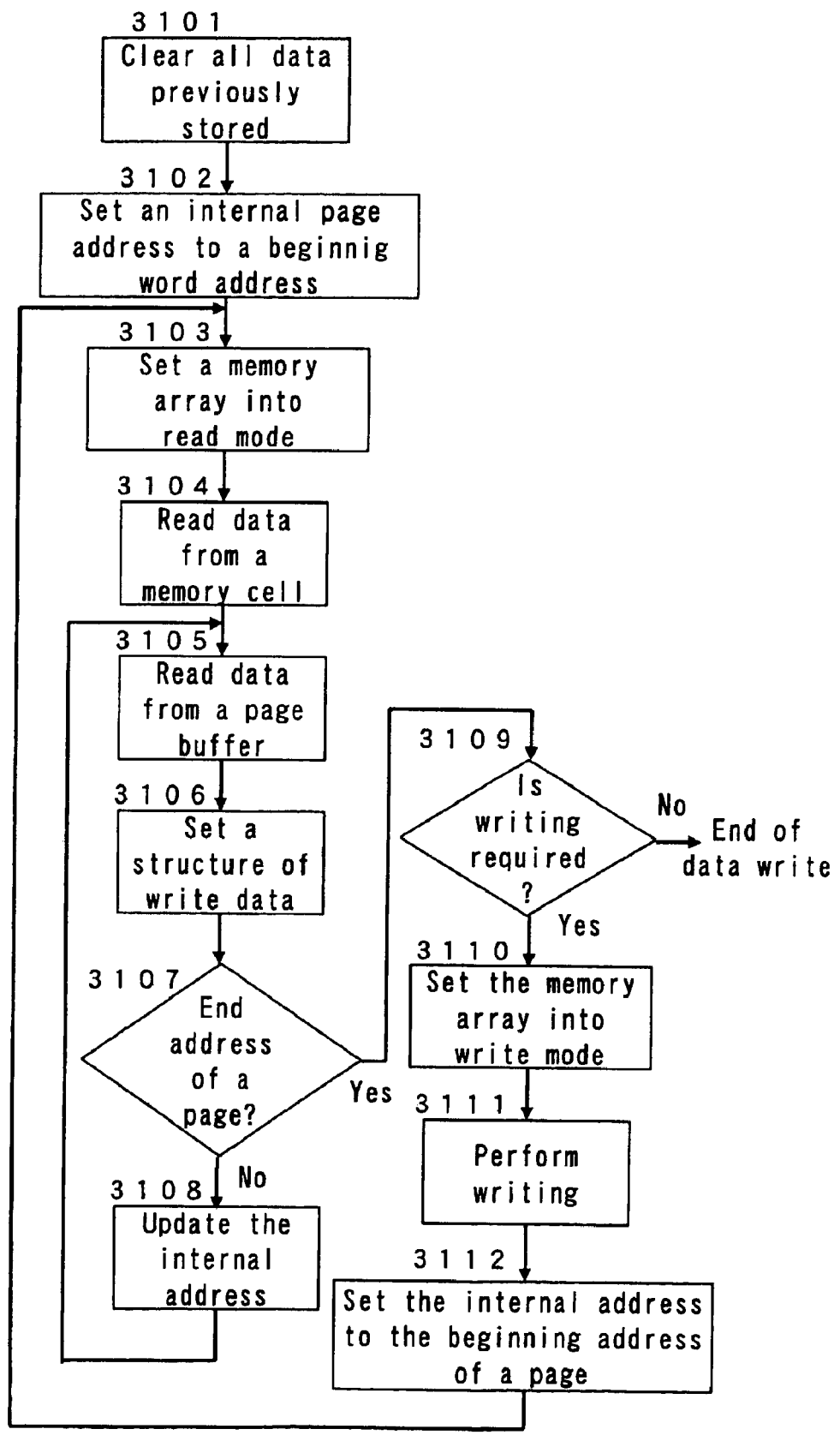
FIG. 7 is a flowchart for explaining a write operation using a page buffer circuit in the semiconductor memory device of Embodiment 2 of the present invention.

FIG. 7 is a flowchart for explaining write procedures in a write operation of the flash memory 200. Note that various settings, verification operations, voltage controls, and the like are actually required in addition to a procedure described below, though description is omitted for procedures which are not directly involved in write operations.

Initially, in step 3101, all write data set in the write register are cleared. Thereby, a write pulse is not applied to a memory cell other than those which are explicitly specified by the write register in a subsequent process.

Next, in step 3102, an internal page address of the flash memory 200 is set to the beginning word address of a page. Subsequent operations are performed on a page-by-page basis. When one operation is changed to another, the internal page address is set again to the beginning word address of a page.

Next, in step 3103, the memory array 150 is set to a read mode. When multi-value memory cells are used, whether or not data write is performed is determined depending on the state of a current memory cell with respect to the threshold voltage of the memory cell. It is necessary that data is read from a memory cell before data write.

Next, in step 3104, data is read from memory cells. In this case, data read is performed from all memory cells in a page.

Next, in step 3105, data to be written at a current internal address is read from the page buffer circuit 120. In this case, by the masking function of the page buffer mask circuit 170, all unnecessary data are masked to be prohibited from being written using a write pulse.

Next, in step 3106, the structure of write data is determined based on the state of the current memory cell read in step 3104 and the data read from the page buffer circuit 120 in step 3105. The determined write data structure is registered in the write register. In this case, data masked by the page buffer mask circuit 170 is prohibited from being written.

Next, in step 3107, it is determined whether or not the current internal address is the end word address of a page. When the current internal address is not the end word address of the page, in step 3108 the internal address is updated to the next word address by an internal address updating section (e.g., the internal address is incremented by an incremented section, or the like) and the process goes back to step 3105. When the current internal address is the end word address of the page, the process goes to step 3109.

In step 3109, since all write data has been prepared, the necessity of application of a write pulse is determined for each piece of data. When there is no memory cell requiring data write, the process is ended. When memory cell(s) requiring data write are present, the memory array 150 is set into a write mode in step 3110 and thereafter data write is performed in step 3111. In this manner, a write operation can be performed up to application of a write pulse to memory cells.

Next, in step 3112, the internal address is set again to the beginning word address of another page and the process goes to step 3103.

With the above-described procedure, writing to a multi-value flash memory can be achieved.

Figure 13:
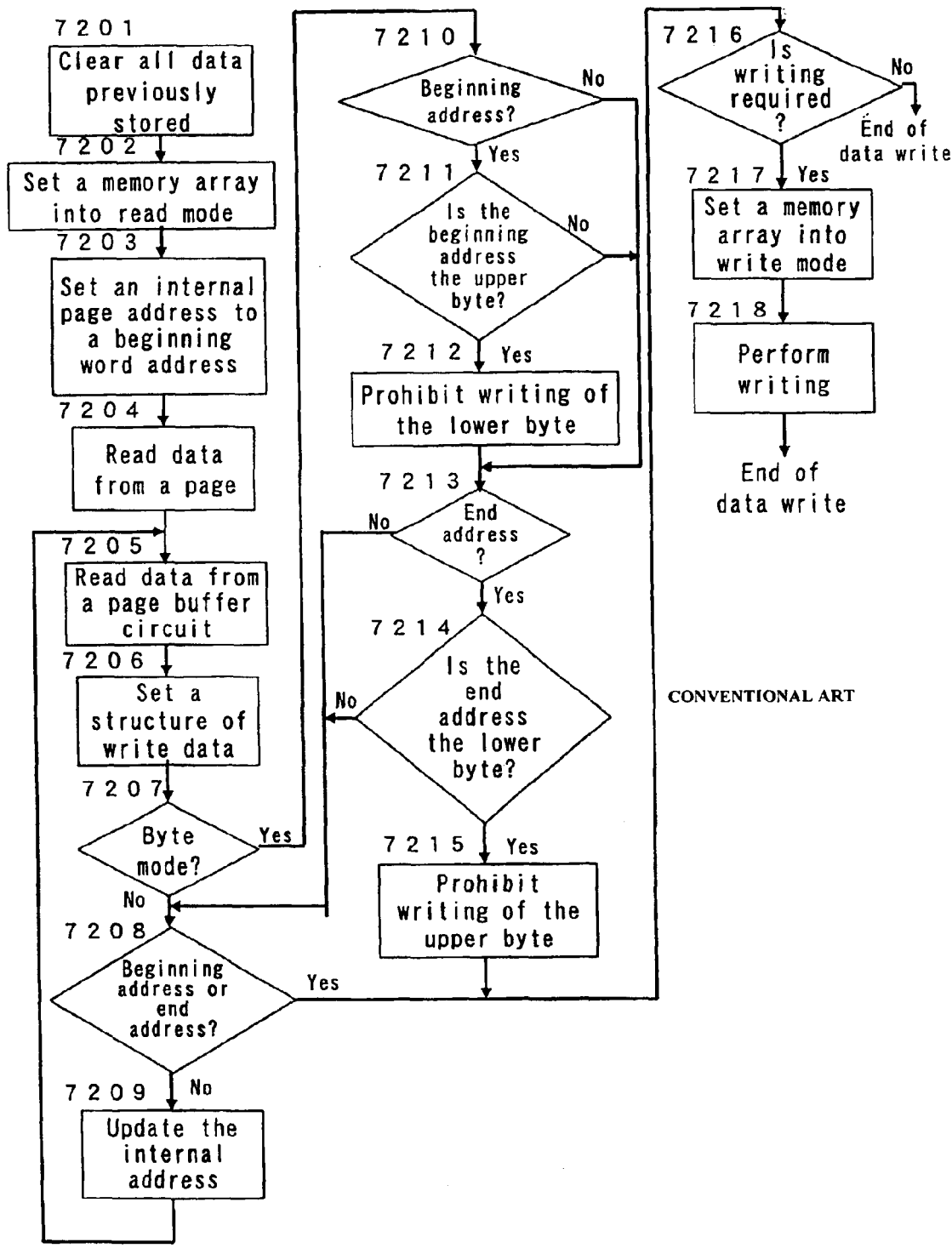
FIG. 13 is a flowchart for explaining still another write operation using a page buffer circuit in the conventional semiconductor memory device.

As can be clearly appreciated from the flowchart of FIG. 7, in Embodiment 2, data that need not be written stored in the page buffer circuit 120 is masked by the page buffer mask circuit 170. Therefore, as compared to the conventional technique for writing data to a multi-value flash memory as described with reference to the flowchart of FIG. 13, processes for determination of a data bus width, determination of a current internal address, and the like can be significantly reduced, thereby making it possible to dramatically simplify the control of the WSM circuit 130.

(Embodiment 3)

Figure 8:
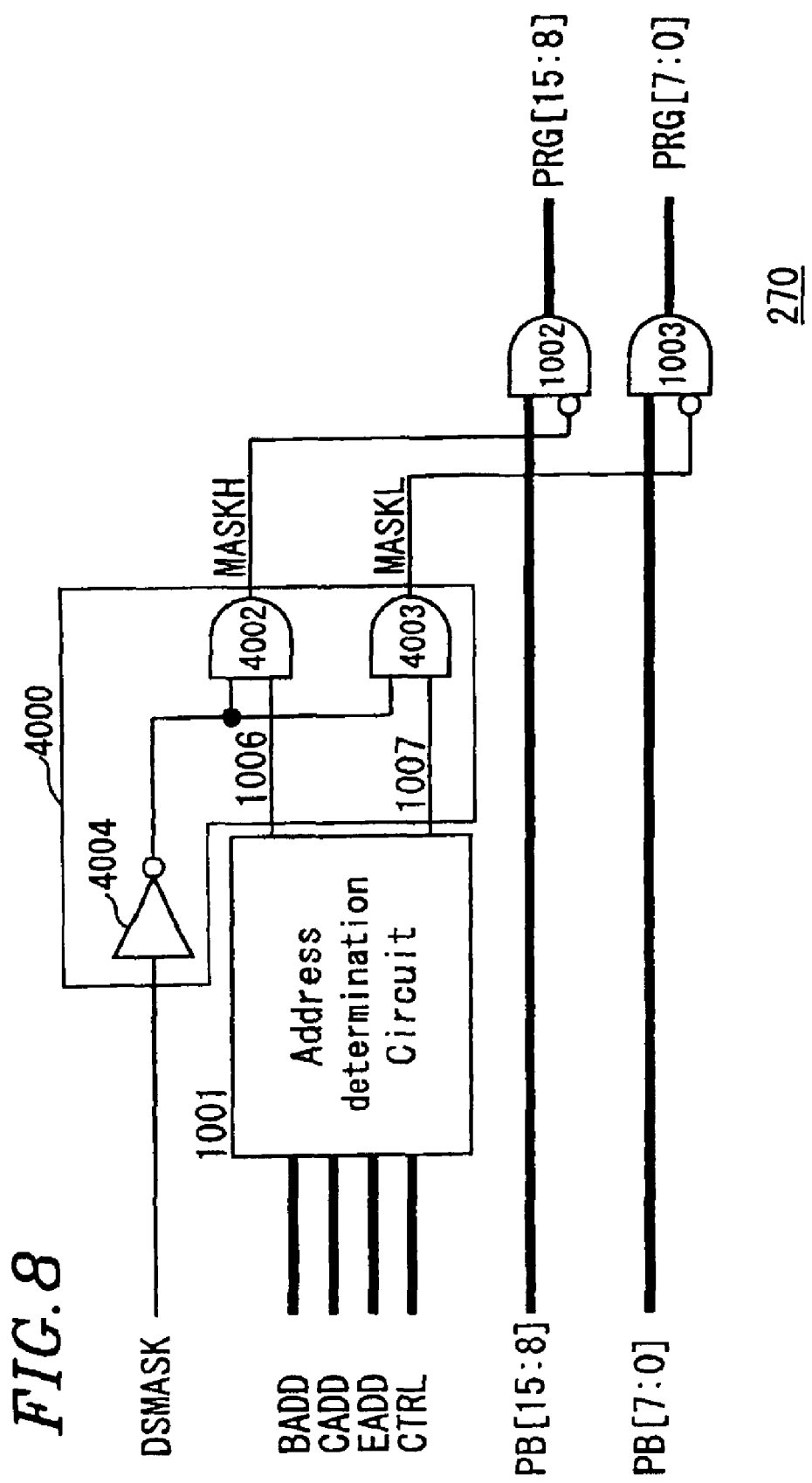
FIG. 8 is a circuit diagram showing a page buffer mask circuit in a semiconductor memory device according to Embodiment 3 of the present invention.

FIG. 8 is a circuit diagram showing an exemplary configuration of a page buffer mask circuit 270 in a flash memory according to Embodiment 3 of the present invention.

The page buffer mask circuit 270 comprises an address determination circuit 1001, AND circuits 1002 and 1003, and a deactivation circuit 4000 which deactivate a masking function.

Here, the address determination circuit 1001 is substantially the same as that which described in Embodiment 1 with reference to FIG. 2.

The deactivation circuit 4000 comprises AND circuits 4002 and 4003 and an inverter circuit 4004.

The page buffer mask circuit 270 can handle both the byte mode where data is processed on a byte-by-byte basis and the word mode where data is processed on a word-by-word basis, as in the page buffer mask circuit 170 described in Embodiment 1 with reference to FIG. 2. The mask determination circuit 1001 is used to control a masking function of masking the upper byte and lower byte of data.

A signal DSMASK, which is a signal for deactivating a masking function, is supplied to one input terminal of each of the AND circuits 4002 and 4003 via the inverter circuit 4004.

The other input terminal of each of the AND circuits 4002 and 4003 is supplied with a signal 1006 or 1007, respectively, output from the address determination circuit 1001.

When the signal DSMASK is at a HIGH level, signals MASKH and MASKL output from the AND circuits 4002 and 4003, respectively, are consistently at a LOW level. Thereby, data output from the page buffer circuit 120 is not masked irrespective of whether or not the signals 1006 and 1007 output from the mask determination circuit 1001 are at the HIGH level or at the LOW level.

When the signal DSMASK is at the LOW level, the masking function described in Embodiments 1 and 2 can be used without alteration.

Thus, by providing the deactivation circuit 4000 which deactivates the masking function, for example, it is possible to read all data stored in the page buffer circuit 120 (FIGS. 1 and 6) without performing the calculation of the end address, the setting of the beginning address, and the like of Embodiments 1 and 2, as in conventional page buffer circuits.

With the mask deactivation circuit 4000, for example, it is possible to read data stored in the page buffer circuit 120 (FIGS. 1 and 6) without taking a current internal address and the like into consideration in testing or the like.

Therefore, according to the semiconductor memory device of the present invention, it is possible to test the device in a manner similar to that of conventional semiconductor memory devices, thereby making it possible to prevent a reduction in convenience of evaluation.

As described above, according to the present invention, by providing a masking section for masking a portion of data read from a page buffer section in a semiconductor memory device comprising a page buffer section for temporarily storing data to be written into memory cells, it is possible to speed up a write operation and simplify write control of a WSM circuit.

Particularly, by applying the present invention to a semiconductor memory device capable of handling a plurality of data bus widths, it is possible to perform the processing of a WSM circuit without taking data bus width into consideration. The present invention is also highly effective for control of writing to multi-value memory cells where data read is performed in a page mode.

Moreover, by providing a deactivation section for deactivating a masking function, it is possible to perform a write operation using a page buffer section in a near-conventional manner.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a memory array comprising a plurality of memory cells;
   a page buffer section for temporarily storing data to be written into the memory array, and wherein data from the page buffer processed for prohibiting unnecessary data from being written into the plurality of memory cells; and a masking section for masking at least a portion of data read from the page buffer section based on a characteristic of a particular write operation regarding that data.

2. A semiconductor memory device according to claim 1, wherein the charactristic is a data bus width in the semiconductor memory device.

3. A semiconductor memory device according to claim 1, wherein:

the masking section comprises a comparison section for comparing a value of an address of the memory array with a value of at least one of a beginning address and an end address of the memory array, when the data is read from the page buffer section; and the characteristic is a result of the comparison by the comparison section.

4. A semiconductor memory device according to claim 1, wherein:

the masking section comprises a matching detection section for determining whether or not an address of the memory array is equal to at least one of a beginning address and an end address of the memory array, when the data is read from the page buffer section; and the characteristic is a resut of the determination by the matching detection section.

5. A semiconductor memory device according to claim 1, wherein:

the masking section comprises a counter section for counting the number of pieces of data to be written into the memory array; and the characteristic is a result of the counting by the counter section.

6. A semiconductor memory device according to claim 1, wherein the masking section comprises a deactivation section for deactivating a portion of the data read from the page buffer section.

7. A semiconductor memory device according to claim 1, wherein:

each of the plurality of memory cells is a multi-value memory cell capable of storing at least three values; and the semiconductor memory device comprises a page mode read section for simultaneously reading some of the plurality of memory cells.

* * * * *